(12) United States Patent
Jang

(45) Date of Patent: Jan. 6, 2015
(10) Patent No.: US 8,928,597 B2

(54) ORGANIC LIGHT EMITTING DISPLAY DEVICE

(75) Inventor: Brent Jang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 543 days.

(21) Appl. No.: 12/684,005

(22) Filed: Jan. 7, 2010

(65) Prior Publication Data

US 2010/0110041 A1 May 6, 2010

Related U.S. Application Data

(63) Continuation-in-part of application No. 12/350,101, filed on Jan. 7, 2009, now Pat. No. 8,629,842.

(60) Provisional application No. 61/080,179, filed on Jul. 11, 2008.

(51) Int. Cl.
   *G06F 3/041* (2006.01)
   *G06F 3/044* (2006.01)

(52) U.S. Cl.
   CPC .............. *G06F 3/044* (2013.01); *G06F 3/0412* (2013.01); *G06F 2203/04111* (2013.01)
   USPC ........................................................ 345/173

(58) Field of Classification Search
   USPC ................................................. 345/173–179
   See application file for complete search history.

(56) References Cited

U.S. PATENT DOCUMENTS

| | | | |
|---|---|---|---|
| 5,550,659 A | 8/1996 | Fujieda et al. | |
| 6,879,319 B2 | 4/2005 | Cok | |
| 6,980,184 B1 | 12/2005 | Stewart et al. | |
| 7,063,902 B2 | 6/2006 | Kikuchi et al. | |
| 7,133,032 B2 | 11/2006 | Cok | |
| 7,394,458 B2 | 7/2008 | Lyon et al. | |
| 7,439,962 B2 | 10/2008 | Reynolds et al. | |
| 7,724,243 B2 | 5/2010 | Geaghan | |
| 7,737,637 B2 | 6/2010 | Koshihara et al. | |
| 7,864,503 B2 | 1/2011 | Chang | |
| 7,876,037 B2 | 1/2011 | Koshihara et al. | |

(Continued)

FOREIGN PATENT DOCUMENTS

| | | |
|---|---|---|
| DE | 103 08 514 A1 | 9/2004 |
| EP | 1 930 968 A2 | 6/2008 |

(Continued)

OTHER PUBLICATIONS

KIPO Registration Determination Certificate dated Oct. 31, 2011, for corresponding Korean Patent application 10-2009-0053490, noting listed references in this IDS, as well as references previously submitted in an IDS dated Mar. 16, 2011, 5 pages.

(Continued)

*Primary Examiner* — Kevin M Nguyen
*Assistant Examiner* — Cory Almeida
(74) *Attorney, Agent, or Firm* — Christie, Parker & Hale, LLP

(57) ABSTRACT

An organic light emitting display device capable of having an electrostatic capacitive type touch panel function without substantially increasing the thickness of the display device and/or including a touch panel with an improved interface between a touch panel module of the touch panel and a touch panel drive integrated circuit (IC) of the touch panel.

25 Claims, 20 Drawing Sheets

(56) References Cited

U.S. PATENT DOCUMENTS

| | | | |
|---|---|---|---|
| 7,936,121 B2 | 5/2011 | Kim | |
| 7,936,338 B2 | 5/2011 | Iwase | |
| 8,052,498 B2 | 11/2011 | Chien et al. | |
| 8,154,530 B2 | 4/2012 | Lin et al. | |
| 8,223,278 B2 | 7/2012 | Kim et al. | |
| 8,283,851 B2 | 10/2012 | Kim et al. | |
| 2002/0005928 A1 | 1/2002 | Hanakawa et al. | |
| 2003/0006971 A1 | 1/2003 | Blanchard | |
| 2003/0006972 A1 | 1/2003 | Blanchard | |
| 2003/0199144 A1 | 10/2003 | Atobe et al. | |
| 2003/0234759 A1 | 12/2003 | Bergquist | |
| 2004/0080267 A1* | 4/2004 | Cok | 313/512 |
| 2004/0095332 A1 | 5/2004 | Blanchard | |
| 2004/0135520 A1 | 7/2004 | Park et al. | |
| 2005/0001964 A1 | 1/2005 | Kubo et al. | |
| 2005/0030048 A1 | 2/2005 | Bolender et al. | |
| 2005/0077820 A1 | 4/2005 | Onishi et al. | |
| 2005/0093466 A1 | 5/2005 | Matsumoto | |
| 2005/0248270 A1 | 11/2005 | Ghosh et al. | |
| 2005/0258441 A1 | 11/2005 | Shitagami | |
| 2006/0033016 A1 | 2/2006 | Ogawa et al. | |
| 2006/0044501 A1 | 3/2006 | Mizusako | |
| 2006/0097251 A1 | 5/2006 | Kang | |
| 2006/0097991 A1 | 5/2006 | Hotelling et al. | |
| 2006/0109222 A1 | 5/2006 | Lee et al. | |
| 2006/0119590 A1 | 6/2006 | Park et al. | |
| 2006/0232559 A1 | 10/2006 | Chien et al. | |
| 2006/0250592 A1 | 11/2006 | Noguchi et al. | |
| 2006/0274055 A1 | 12/2006 | Reynolds et al. | |
| 2007/0046186 A1 | 3/2007 | Kim | |
| 2007/0062739 A1 | 3/2007 | Philipp et al. | |
| 2007/0216657 A1 | 9/2007 | Konicek | |
| 2007/0240914 A1* | 10/2007 | Lai et al. | 178/18.06 |
| 2007/0242055 A1 | 10/2007 | Lai | |
| 2007/0268243 A1 | 11/2007 | Choo et al. | |
| 2008/0001926 A1* | 1/2008 | XiaoPing et al. | 345/173 |
| 2008/0007534 A1 | 1/2008 | Peng et al. | |
| 2008/0165158 A1 | 7/2008 | Hotelling et al. | |
| 2008/0211395 A1 | 9/2008 | Koshihara et al. | |
| 2008/0246704 A1 | 10/2008 | Kawase | |
| 2008/0277259 A1 | 11/2008 | Chang | |
| 2008/0278787 A1 | 11/2008 | Sasagawa | |
| 2008/0278788 A1 | 11/2008 | Sasagawa | |
| 2008/0309633 A1 | 12/2008 | Hotelling et al. | |
| 2008/0309635 A1 | 12/2008 | Matsuo | |
| 2009/0072724 A1 | 3/2009 | Seki et al. | |
| 2009/0160822 A1 | 6/2009 | Eguchi et al. | |
| 2009/0213090 A1 | 8/2009 | Mamba et al. | |
| 2009/0251431 A1 | 10/2009 | Lee et al. | |
| 2009/0303195 A1 | 12/2009 | Yamato et al. | |
| 2010/0007616 A1 | 1/2010 | Jang | |
| 2010/0013745 A1 | 1/2010 | Kim et al. | |
| 2010/0207864 A1 | 8/2010 | Tashiro et al. | |
| 2010/0214247 A1 | 8/2010 | Tang et al. | |
| 2011/0032209 A1 | 2/2011 | Kim | |
| 2011/0057893 A1 | 3/2011 | Kim et al. | |

FOREIGN PATENT DOCUMENTS

| | | |
|---|---|---|
| EP | 1 930 968 A3 | 6/2011 |
| JP | 03-134925 | 6/1991 |
| JP | 07-036017 | 2/1995 |
| JP | 2003-196023 | 7/2003 |
| JP | 2005-521207 | 7/2005 |
| JP | 2005-339406 | 12/2005 |
| JP | 2006-302251 | 11/2006 |
| JP | 2007-086075 | 4/2007 |
| JP | 2007-299385 | 11/2007 |
| JP | 2008-009476 | 1/2008 |
| JP | 2008-310551 | 12/2008 |
| KR | 2003-0028973 | 4/2003 |
| KR | 10-2006-0044254 | 5/2006 |
| KR | 10-2006-73513 | 6/2006 |
| KR | 10-0612240 B1 | 8/2006 |
| KR | 10-0743545 B1 | 7/2007 |
| KR | 10-2007-0102414 | 10/2007 |
| KR | 10-2008-80913 | 9/2008 |
| KR | 10-2008-0110477 | 12/2008 |
| KR | 10-2009-0058072 | 6/2009 |
| KR | 10-2009-68165 | 6/2009 |
| TW | 200739400 | 10/2007 |
| TW | 200739402 A | 10/2007 |
| WO | WO 03/079449 A1 | 9/2003 |
| WO | WO 2008/002043 A1 | 1/2008 |
| WO | WO 2008/032476 A1 | 3/2008 |
| WO | WO 2008/047990 A1 | 4/2008 |

OTHER PUBLICATIONS

U.S. Office action dated Dec. 1, 2011, for cross reference U.S. Appl. No. 12/350,101, 14 pages.
European Search Report dated Nov. 12, 2009, for corresponding European application 09251664.0, noting listed references in this IDS, except KR 2003-0028973.
Japanese Office action dated Aug. 2, 2011, for corresponding Japanese Patent application 2009-163881, noting references in this IDS, 4 pages.
Office action for Chinese Patent Application No. 200910138692.5, dated Dec. 2, 2013, 8 pages.
KIPO Office action dated Jan. 7, 2011, for corresponding Korean Patent application 10-2009-0053490, noting listed reference in this IDS.
Japanese Office action dated Feb. 28, 2012, for Japanese Patent application 2009-163880, 2 pages.
European Office action dated May 22, 2012, for European Patent application 09251837.2, (9 pages).
U.S. Office action dated May 23, 2012, for U.S. Appl. No. 12/350,101, ( 15 pages).
KIPO Registration Determination Certificate dated Jun. 17, 2011, for Korean Patent application 10-2009-0053489, noting listed foreign references in this IDS.
U.S. Office action dated Jun. 23, 2011, for cross-reference U.S. Appl. No. 12/350,101, 13 pages.
European Search Report dated Sep. 14, 2011, for European Patent application 09251837.2, noting listed references in this IDS (Category X and Y only), 9 pages.
European Office action dated Aug. 23, 2012, for European Patent application 09251664.0, (6 pages).
U.S. Office action dated Aug. 17, 2012, for cross reference U.S. Appl. No. 12/409,375, (28 pages).
SIPO Office action dated Jul. 24, 2012, for Chinese Patent application 200910138692.5, (7 pages).
Japanese Office action dated Jan. 15, 2013, for Japanese Patent application 2011-140402, (2 pages).
U.S. Office action dated Feb. 28, 2013, for cross reference U.S. Appl. No. 12/409,375, (19 pages).
JPO Office action dated Apr. 9, 2013, for corresponding Japanese Patent application 2012-076237, (2 pages).
KIPO Office action dated Feb. 16, 2011 for Korean Patent application 10-2009-0072401, (4 pages).
U.S. Office action dated Jul. 3, 2012, for cross reference U.S. Appl. No. 12/790,062, (12 pages).
U.S. Office action dated Jul. 18, 2013, for cross reference U.S. Appl. No. 12/790,062, (17 pages).
U.S. Notice of Allowance dated Sep. 11, 2013, for cross reference parent U.S. Appl. No. 12/350,101, (9 pages).
U.S. Office action dated Sep. 12, 2013, for cross reference U.S. Appl. No. 12/409,375, (17 pages).
U.S. Office action dated Mar. 13, 2014, for cross reference U.S. Appl. No. 12/409,375, (17 pages).

* cited by examiner

ORGANIC LIGHT EMITTING DISPLAY DEVICE

CROSS-REFERENCE TO RELATED PATENT APPLICATIONS

The present application is a Continuation-in-Part of U.S. patent application Ser. No. 12/350,101, filed Jan. 7, 2009, which claims priority to and the benefit of U.S. Provisional Patent Application No. 61/080,179, filed on Jul. 11, 2008, the entire contents of both of which are incorporated herein by reference.

BACKGROUND OF THE INVENTION

1. Field of the Invention

The present invention relates to an organic light emitting display device, and more particularly, to an organic light emitting display device having an electrostatic capacitive type touch panel function.

2. Description of the Related Art

Recently, the use of portable thin flat display devices has increased considerably. A representative example of a flat display devices is an electroluminescent display device, which is an active matrix type display device expected to become the next generation display device due to its wide viewing angle, high contrast, and fast response speed. Also, compared to an inorganic light emitting display device, an organic light emitting display device having an emissive layer formed of an organic material has better luminance, driving voltage, and response speed, and is capable of realizing multi-colors.

In order to allow a user to input a command via a finger or a pen-type pointer, many studies have been conducted to obtain an organic light emitting display device having a touch panel function, such as an internal electrostatic capacitive type touch panel display device.

However, in the case of an organic light emitting display device having a internal electrostatic capacitive type touch panel, the thickness of the touch panel is increased in order to embed the touch panel function. In addition, a display drive integrated circuit (DDI) and a touch panel drive IC have to be separately arranged resulting in compatibility issues between the products. Also, it is difficult to attach the touch panel drive IC to a flexible printed circuit board (PCB).

SUMMARY OF THE INVENTION

An aspect of an embodiment of the present invention is directed toward an organic light emitting display device including an encapsulation substrate, an inner surface of which is patterned using indium tin oxide (ITO) pattern so that a touch panel function can be provided without substantially increasing the thickness of the display device.

An aspect of an embodiment of the present invention is directed toward an organic light emitting display device including a touch panel that does not substantially increase the thickness of the display device, and/or including an improved interface between a touch panel module of the touch panel and a touch panel drive integrated circuit (IC) of the touch panel.

An embodiment of the present invention provides an organic light emitting display device. The organic light emitting display device includes: a substrate; a display unit on the substrate; an encapsulation substrate having a first side facing the display unit, and a second side facing away from the display unit; a touch unit comprising a plurality of first sensors and a plurality of second sensors, the plurality of second sensors being on the second side, the plurality of first sensors being electrically coupled to each other and extending in parallel rows along a first direction, and the plurality of second sensors being electrically coupled to each other and extending in parallel columns along a second direction crossing the first direction; and an insulating layer on at least a portion of the plurality of first and second sensors.

In one embodiment, the plurality of first sensors and the plurality of second sensors are alternately arranged.

In one embodiment, a protrusion unit of each of the plurality of first sensors in a plane parallel to the substrate is offset from a protrusion unit of each of the plurality of second sensors in the plane.

In one embodiment, the organic light emitting display device further includes a flexible printed circuit board (PCB) electrically coupled to the plurality of first sensors and the plurality of second sensors. The organic light emitting display device may further include a connector for delivering electrical signals generated by the touch unit to the flexible PCB, and the connector may be electrically coupled to the plurality of first sensors and the plurality of second sensors. The flexible PCB may include a circuit for driving and controlling the display unit and the touch unit.

In one embodiment, the display unit includes: a thin film transistor (TFT) on the substrate; and an organic light emitting diode (OLED) electrically coupled to the TFT. The OLED includes a counter electrode, a pixel electrode, and an intermediate layer between the counter electrode and the pixel electrode. The pixel electrode may contact a portion of the TFT, the intermediate layer may contact a portion of the pixel electrode, and the counter electrode may contact a portion of the intermediate layer.

In one embodiment, the plurality of first sensors and the plurality of second sensors include indium tin oxide (ITO).

In one embodiment, the plurality of first sensors and the plurality of second sensors are configured to generate electrical signals indicative of a touch.

In one embodiment, each of the plurality of first sensors includes a first diamond-shaped pad, and each of the plurality of second sensors includes a second diamond-shaped pad at a position adjacent to one of the first diamond-shaped pads.

In one embodiment, the first direction is perpendicular to the second direction.

In one embodiment, the touch unit is an electrostatic capacitive type touch unit.

In one embodiment, the organic light emitting display device further includes: a first pattern layer on the second side of the encapsulation substrate and including the plurality of first and second sensors; and a second pattern layer on the insulating layer, the second pattern layer including a plurality of pattern units, each of the plurality of pattern units being formed to be connected to two of the plurality of second sensors on the first pattern layer. The organic light emitting display may further include a second insulating layer on at least a portion of the second pattern layer. The insulating layer may have a plurality of contact holes, and the plurality of pattern units may be electrically couple to the plurality of second sensors via the plurality of contact holes. Each of the plurality of first sensors may include a first diamond-shaped pad, each of the plurality of second sensors may include a second diamond-shaped pad at a position adjacent to one of the first diamond-shaped pads, and the plurality of contact holes may be at positions corresponding to corners of the second diamond-shaped pads of the plurality of second sensors, where adjacent second sensors are coupled to each other. The plurality of pattern units may be configured to fill the plurality of contact holes to electrically couple the plurality of second sensors that are adjacent to each other on the first pattern layer. The display unit may include a thin film transistor (TFT) on the substrate and an organic light emitting diode (OLED) electrically coupled to the TFT. The OLED may include a counter electrode, a pixel electrode, and an intermediate layer between the counter electrode and the pixel electrode, and the counter electrode and the first pattern layer may be configured to form a first capacitor. The first pattern layer may be further configured to form a second capacitor with an object approaching the encapsulation substrate, and the first capacitor may be electrically coupled in series with the second capacitor. The organic light emitting display device may further include a flexible printed circuit board (PCB) electrically coupled to the plurality of first sensors and the plurality of second sensors, and the flexible PCB may include a circuit for driving and controlling the touch unit. The organic light emitting display device may further include a connector for delivering an electrical signal generated by the touch unit to the flexible PCB, and the connector may be electrically coupled to the plurality of first sensors and the plurality of second sensors. In one embodiment, the organic light emitting display device further includes: a first pattern layer on the second side of the encapsulation substrate and including the plurality of first sensors; the insulating layer on at lease a portion of the first pattern layer; a second pattern layer on at least a portion of the insulating layer and including the plurality of second sensors; and a second insulating layer on at least a portion of the second pattern layer. Each of the plurality of first sensors may include a first diamond-shaped pad, and each of the plurality of second sensors may include a second diamond-shaped pad at a position adjacent to one of the first diamond-shaped pads. A plurality of first connecting units may be configured to electrically couple the plurality of first sensors that are adjacent to each other on the first pattern layer, and a plurality of second connecting units may be configured to electrically couple the second sensors that are adjacent to each other on the second pattern layer. The display unit may include a thin film transistor (TFT) on the substrate and an organic light emitting diode (OLED) electrically coupled to the TFT. The OLED may include a counter electrode, a pixel electrode and an intermediate layer between the counter electrode and the pixel electrode. The counter electrode and the first pattern layer may be configured to form a first capacitor. The first pattern layer may be further configured to form a second capacitor with an object approaching the encapsulation substrate, and the first capacitor may be electrically coupled in series with the second capacitor. The organic light emitting display device may further include a flexible printed circuit board (PCB) electrically coupled to the plurality of first sensors and the plurality of second sensors, and the flexible PCB may include a circuit for driving and controlling the touch unit. The organic light emitting display device may further include a connector for delivering an electrical signal generated by the touch unit to the flexible PCB, and the connector may be electrically coupled to the plurality of first sensors and the plurality of second sensors.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
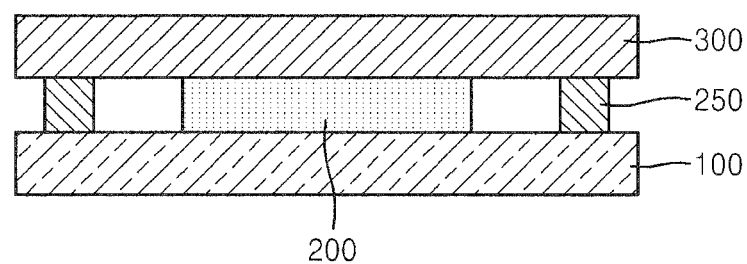
FIG. 1 is a cross-sectional schematic view of a portion of an organic light emitting display device according to a first embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed there between. Like reference numerals designate like elements throughout the specification.

First Embodiment

Figure 2:
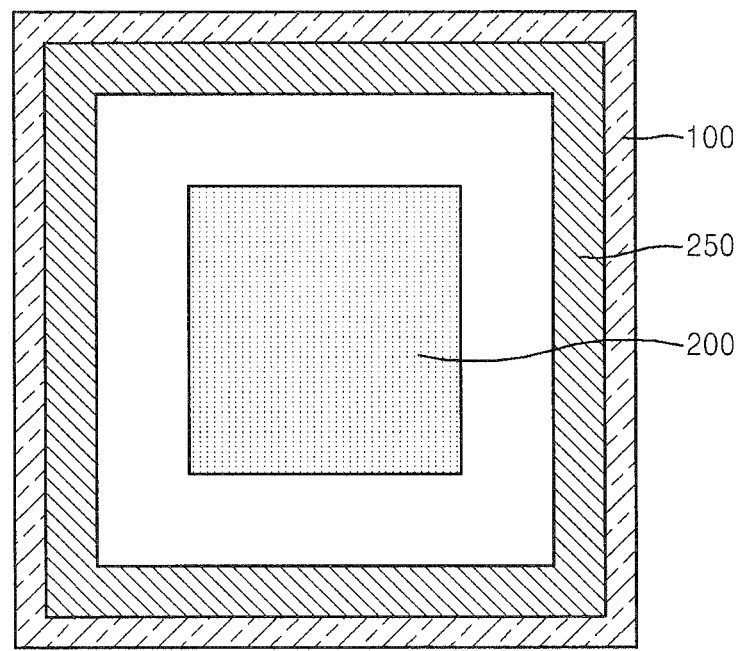
FIG. 2 is a plan schematic view of the organic light emitting display device of FIG. 1.

FIG. 1 is a cross-sectional schematic view of a portion of an organic light emitting display device according to a first embodiment of the present invention, and FIG. 2 is a plan schematic view of the organic light emitting display device of FIG. 1. In FIG. 2, an encapsulation substrate 300 illustrated in FIG. 1 is not shown.

Referring to FIGS. 1 and 2, a display unit 200 including a plurality of organic light emitting diodes (OLEDs) is formed on a substrate 100.

The substrate 100 may be formed of transparent glass containing $SiO_2$ as a main component, but is not limited thereto, and thus may also be formed of a transparent plastic material that may be an insulating organic material selected from the group consisting of polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), cellulose acetate propionate (CAP), and combinations thereof.

In one embodiment, if the organic light emitting display device of FIGS. 1 and 2 is a bottom emission type organic light emitting display device in which an image is realized toward the substrate 100, the substrate 100 is preferably formed of a transparent material. However, in another embodiment, if the organic light emitting display device of FIGS. 1 and 2 is a top emission type organic light-emitting display device in which an image is realized away from the substrate 100, the substrate 100 may not be necessarily formed of a transparent material, and, in this case, the substrate 100 may be formed of a metal. When the substrate 100 is formed of a metal, the substrate 100 may include at least one material selected from the group consisting of carbon, iron, chromium, manganese, nickel, titanium, molybdenum, stainless steel (SUS), Invar alloys, Inconel alloys, and Kovar alloys, but is not limited thereto. In addition, the substrate 100 may also be formed of a metal foil.

Moreover, a buffer layer may be further formed on a top surface of the substrate 100 to planarize the substrate 100 and prevent or reduce impurities from penetrating into the bottom emission type organic light emitting display device.

The substrate 100, having the display unit 200 formed thereon, is attached to the encapsulation substrate 300 that is disposed above the display unit 200. The encapsulation substrate 300 may be formed of not only a glass material but also of various suitable plastic materials such as acryl, and furthermore, a metal. The encapsulation substrate 300 and touch panel related members formed on a surface of the encapsulation substrate 300 will be described later in more detail with reference to subsequent FIGS. 3A-3E.

Also, the substrate 100 and the encapsulation substrate 300 are attached to each other by using a sealant 250. The sealant 250 may be any suitable sealing glass frit. Also, the sealant 250 may be formed of an organic sealant, an inorganic sealant, or of a mixture of the organic and inorganic sealants.

Hereinafter, the encapsulation substrate 300, and the touch panel related members formed on the surface of the encapsulation substrate 300 in the organic light emitting display device according to the first embodiment of the present invention will now be described in more detail.

Figure 3A:
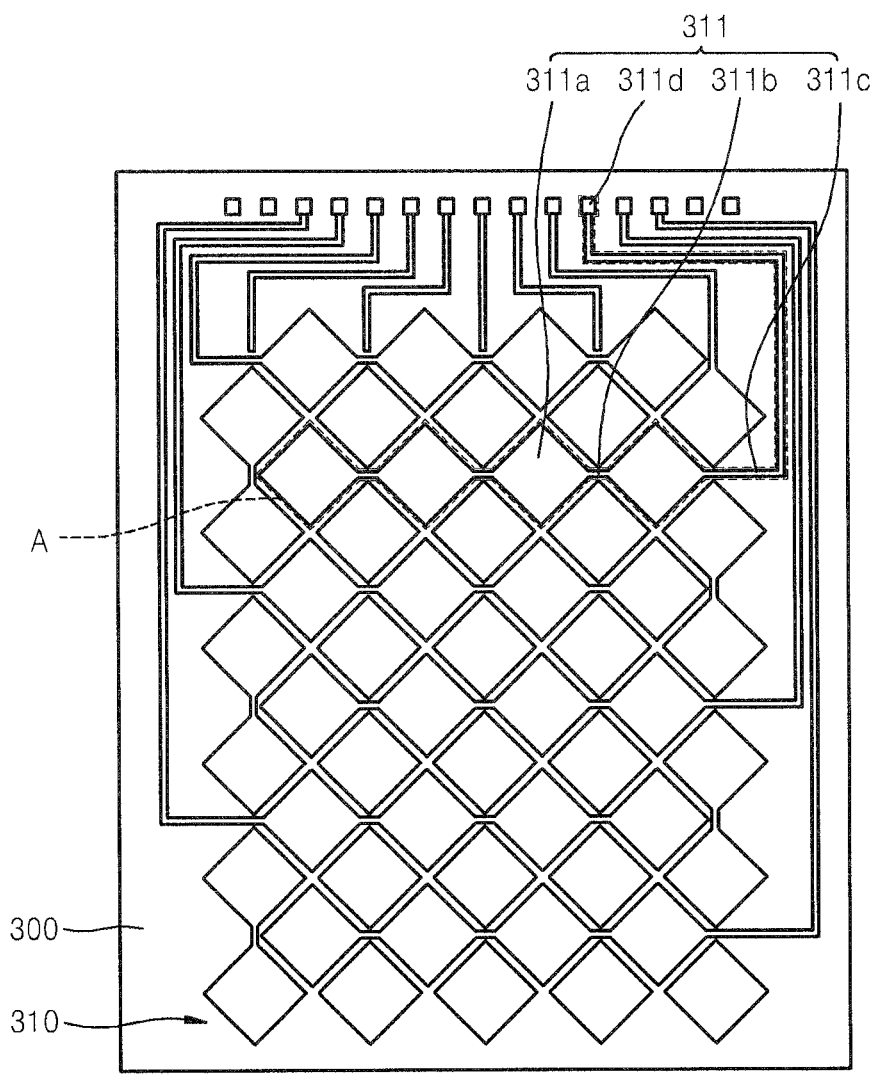
FIGS. 3A and 3B are bottom schematic views of an encapsulation substrate and a first pattern layer formed on a surface of the encapsulation substrate in the organic light emitting display device of FIG. 1.
Figure 3A:
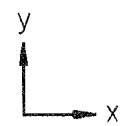
Figure 3B:
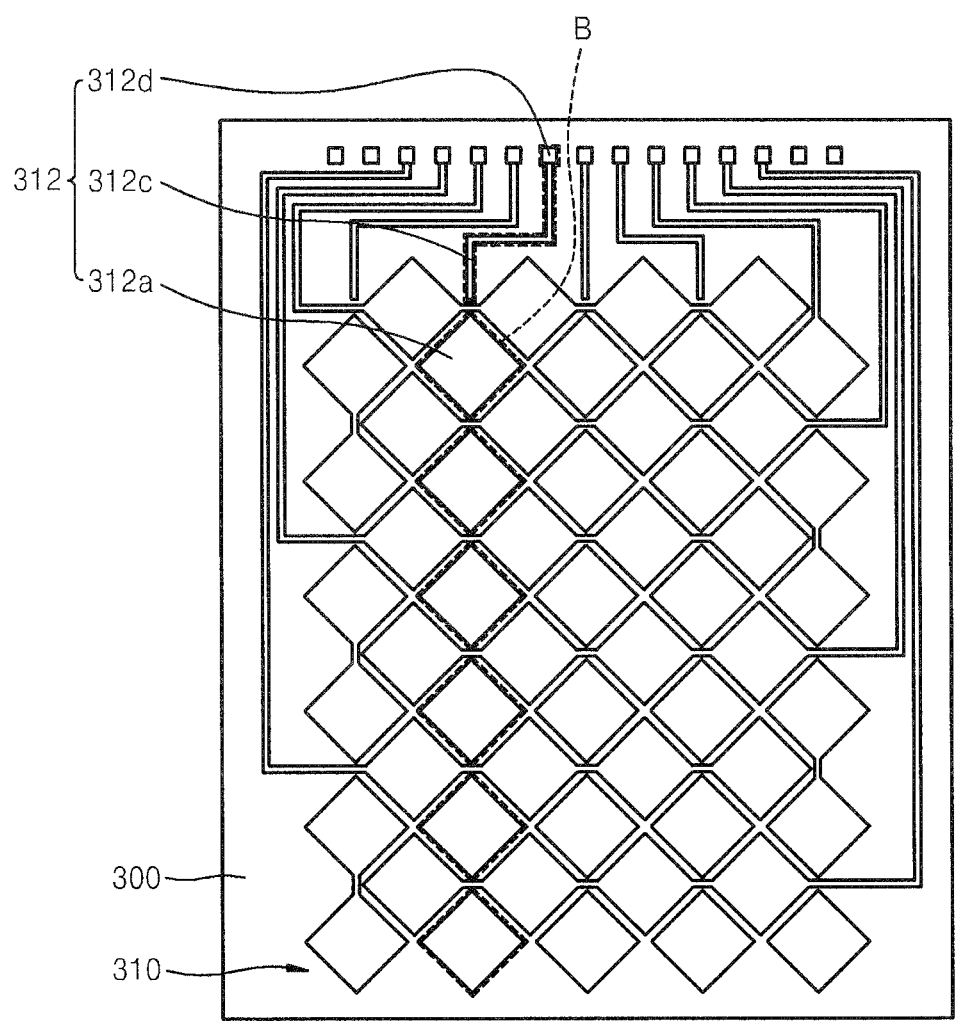
Figure 3C:
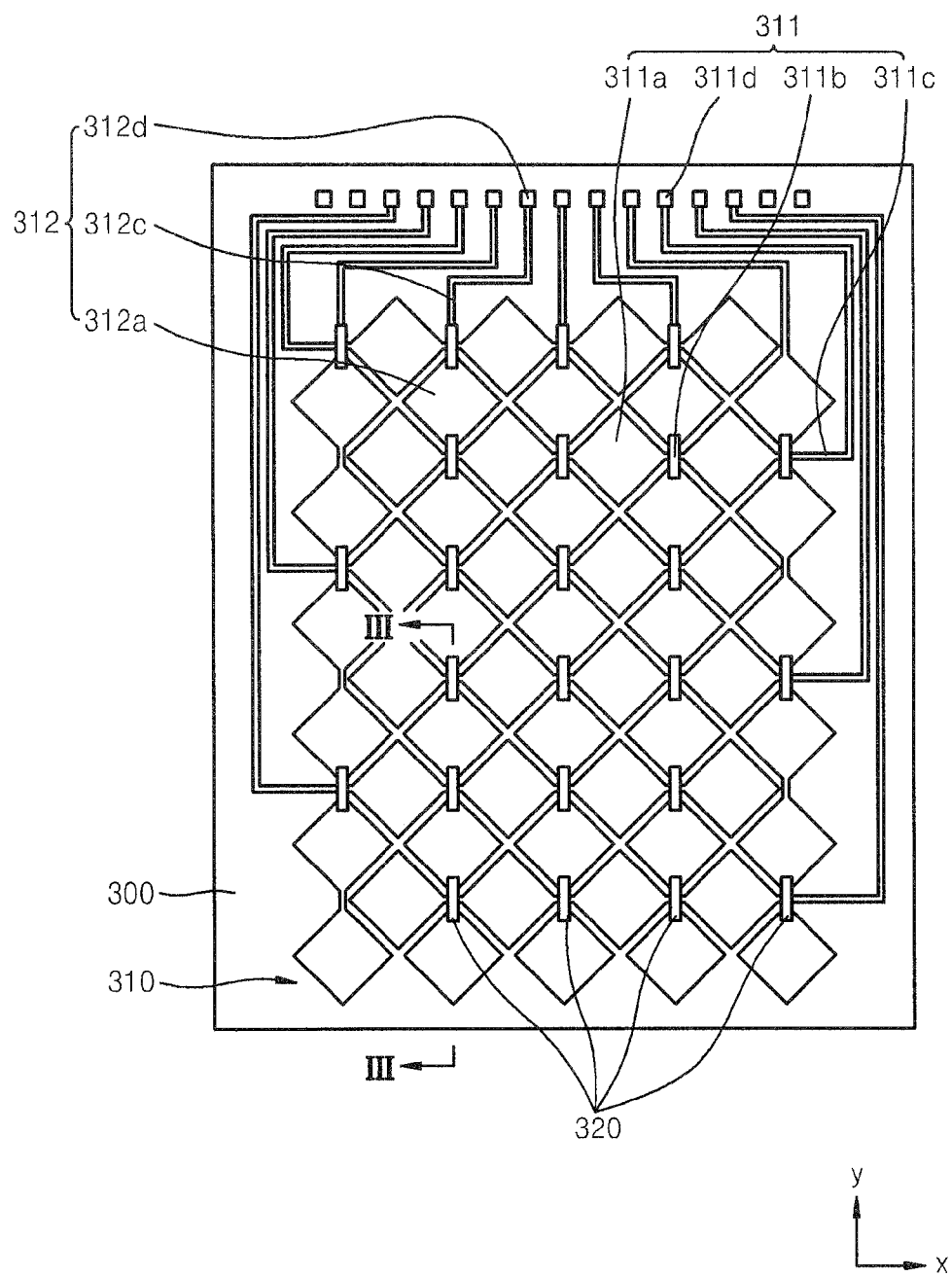
FIG. 3C is a bottom schematic view of the first pattern layer of FIGS. 3A and 3B, and a second pattern layer on the first pattern layer.
Figure 3D:
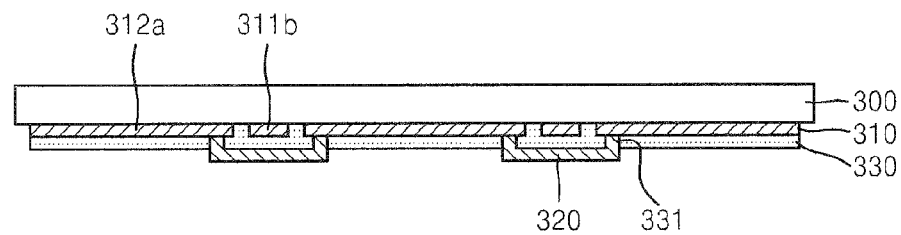
FIG. 3D is a cross-sectional schematic view taken along line III-III in FIG. 3C.
Figure 3E:
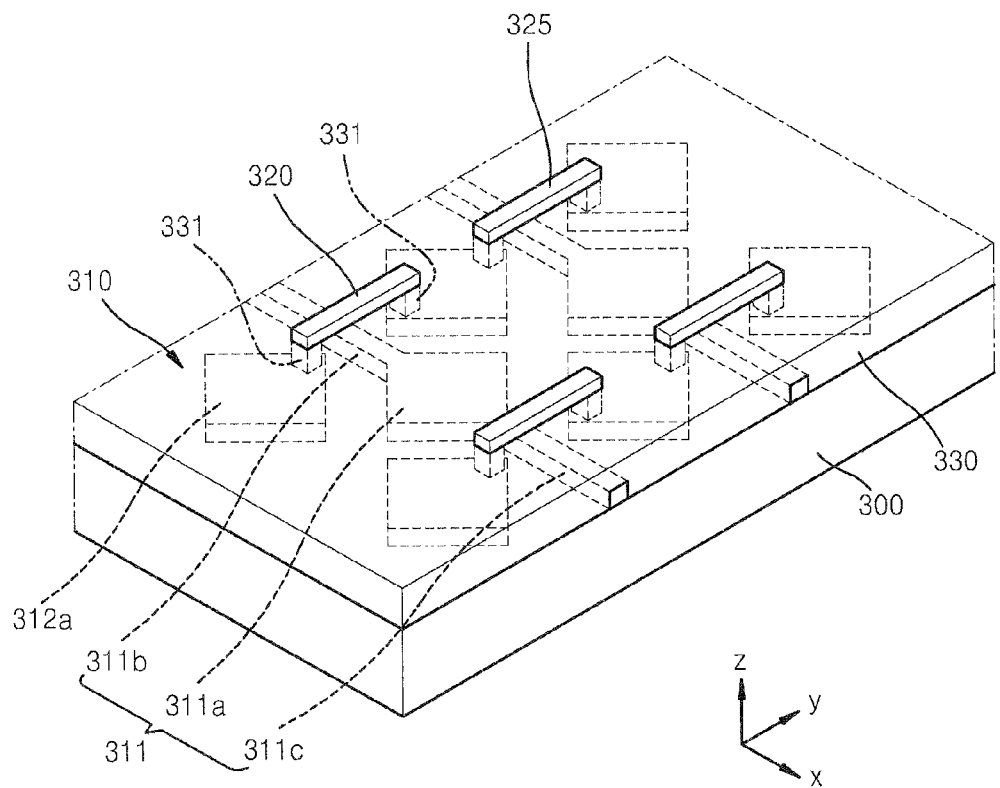
FIG. 3E is a bottom perspective schematic view of the first pattern layer and the second pattern layer of FIG. 3C.

FIGS. 3A and 3B are bottom schematic views of the encapsulation substrate 300 and a first pattern layer formed on a surface of the encapsulation substrate 300 in the organic light emitting display device of FIG. 1. FIG. 3C is a bottom schematic view of the first pattern layer of FIGS. 3A and 3B, and a second pattern layer on the first pattern layer. FIG. 3D is a cross-sectional schematic view taken along line III-III in FIG. 3C. FIG. 3E is a bottom perspective schematic view of the first pattern layer and the second pattern layer of FIG. 3C.

Referring to FIGS. 3A through 3E, a first pattern layer 310, a first insulating layer 330, a second pattern layer 320, and a second insulating layer 340 (see FIG. 5) are sequentially formed on a surface of the encapsulation substrate 300, respectively, to face the substrate 100.

An issue with a conventional organic light emitting display device having an internal electrostatic capacitive type touch panel is that the thickness of the display device is increased in order to realize a touch panel function. In order to address this issue, an indium tin oxide (ITO) pattern is formed on an inner surface of the encapsulation substrate 300 of the organic light emitting display device according to the first embodiment of the present invention.

To be more specific, the first pattern layer 310 is formed on the surface of the encapsulation substrate 300 to face the substrate 100 (see FIG. 1). The first pattern layer 310 includes a plurality of first direction pattern units 311 formed in parallel rows along a first direction (the X direction in FIG. 3A), and a plurality of second direction pattern units 312 formed in parallel columns along a second direction (the Y direction in FIG. 3B) (or is substantially perpendicular to) the first direction. As illustrated in FIGS. 3A and 3B, the first direction pattern units 311 and the second direction pattern units 312 are alternately disposed. That is, the first direction pattern units 311, each having a square shaped body rotated 45 degrees like a baseball diamond, are formed in parallel rows where horizontally opposite corners of each diamond are adjacent and coupled along the first direction (the X direction in FIG. 3A) on the surface of the encapsulation substrate 300. Similarly, the second direction pattern units 312, each having a square shaped body rotated 45 degrees like a baseball diamond, are formed in parallel columns where vertically opposite corners of each diamond are adjacent and coupled along the second direction (the Y direction in FIG. 3B) between each of the first direction pattern units 311. Here, in a number of embodiments, the pattern units (311 and 312) are utilized as sensors (or sensor pads).

Reference character A refers to one row of first direction pattern units 311 of FIG. 3A, where each role of first direction pattern units 311 includes a plurality of main bodies 311a, a plurality of connecting units 311b, an extending unit 311c, and a contact unit 311d. The main bodies 311a have a diamond shape, and are formed in a row along the first direction, i.e., the X direction in FIG. 3A. The connecting units 311b are formed between each of the main bodies 311a, and respectively connect the main bodies 311a that are adjacent to each other. The connecting units 311b are formed between each of the main bodies 311a, and respectively connect the main bodies 311a that are adjacent to each other. The extending unit 311c extends from an end of each of the first direction pattern units 311. The extending unit 311c may be formed to extend in a direction, e.g., the Y direction in FIG. 3A, so that the plurality of extending units 311c may be arranged at one end (or end portion) of the encapsulation substrate 300, that is, an upper end of the encapsulation substrate 300 in FIG. 3A. The contact unit 311d is formed at an end (or upper end portion) of the extending unit 311c, and is electrically connected (or electrically coupled) to a substrate contact unit 112 of a data line 110 (see FIG. 5) on the substrate 100 (see FIG. 5) via a conductive member 120 (see FIG. 5).

In FIG. 3B, reference character B refers to one column of second direction pattern units 312. Each column of second direction pattern units 312 includes a plurality of main bodies 312a, an extending unit 312c, and a contact unit 312d. The main bodies 312a have a diamond shape, and are formed in a column along the second direction, i.e., the Y direction in FIG. 3B. Unlike the first direction pattern units 311, none of the second direction pattern units 312 includes a connecting unit. The main bodies 312a are connected to each other not by a connecting unit but by the second pattern layer 320 having, e.g., a plurality of third pattern units 325 for connecting the main bodies 312a to each other (see FIG. 3E). The extending unit 312c extends from a contact unit 312d to a point in close proximity to a corner of a diamond shaped main body 312a closest to an upper end of the encapsulation substrate 300. The extending unit 312c may be formed to extend in a direction, e.g., the Y direction in FIG. 3B, so that a plurality of extending units 312c may be arranged at one end of the encapsulation substrate 300, that is, an upper end of the encapsulation substrate 300 in FIG. 3B. The contact unit 312d is formed at an end of the extending unit 312c, and is electrically connected (or electrically coupled) to a substrate contact unit of the data line 110 (see FIG. 5) on the substrate 100 (see FIG. 5) via the conductive member 120 (see FIG. 5).

Referring to FIGS. 3D and 3E, the first insulating layer 330 is formed on the surface of the encapsulation substrate 300 such that it faces the substrate 100 (see FIG. 1) and covers the first pattern layer 310. The first insulating layer 330 insulates the first pattern layer 310 from the second pattern layer 320. A plurality of contact holes (or vias) 331 may be formed at predetermined positions in the first insulating layer 330, e.g., at positions that correspond to adjacent corners of the diamond shaped main bodies 312a of the second direction pattern units 312. The second pattern layer 320 and the main bodies 312a of the second direction pattern units 312 are electrically connected (or electrically coupled) via the contact holes 331.

As illustrated in FIGS. 3C through 3E, the second pattern layer 320 is formed on a surface of the first insulating layer 330 to face the substrate 100 (see FIG. 1). The second pattern layer 320, a conductive layer, is formed such that it fills the contact holes 331 of the first insulating layer 330, thereby electrically connecting (e.g. by vias and third pattern units 325) the main bodies 312a of second direction pattern units 312, that are adjacent to each other.

In this manner, the first direction pattern units 311 and the second direction pattern units 312, which are alternately disposed, do not intersect (or electrically couple) each other, so that a short circuit between the first direction pattern units 311 and the second direction pattern units 312 is prevented.

The first pattern layer 310 and the second pattern layer 320 may be formed of suitable transparent materials such as ITO, IZO, ZnO, and/or In2O3. Also, the first pattern layer 310 and the second pattern layer 320 may be formed by using a photolithography process. That is, an ITO layer formed by using a suitable deposition method, a spin coating method, a sputtering method, or an inkjet method may be used to form the first pattern layer 310 and the second pattern layer 320.

Figure 5:
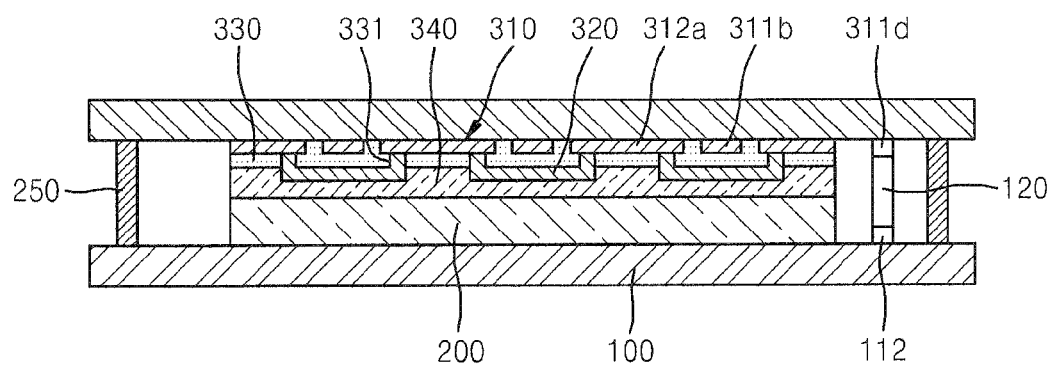
FIG. 5 is a cross-sectional schematic view of the organic light emitting display device of FIG. 4.

Referring now to FIG. 5, a second insulating layer 340 is formed both on the surface of the first insulating layer 330 to face the substrate 100 and on the surface of the second pattern layer 320. An opposite side of the second insulating layer 340 abuts the display unit 200. The second insulating layer 340 insulates the second pattern layer 320 from a display unit 200.

In this manner, according to one embodiment of the present invention, it is possible to realize a touch panel function without increasing the thickness of a display device. Also, because an electrostatic capacitive pattern is formed on the inner surface of the encapsulation substrate 300, slim (or thin) etching is possible.

Hereinafter, the connection relationship between a pattern layer of an encapsulation substrate, and a printed circuit board (PCB) of a substrate will now be described in more detail.

Figure 4:
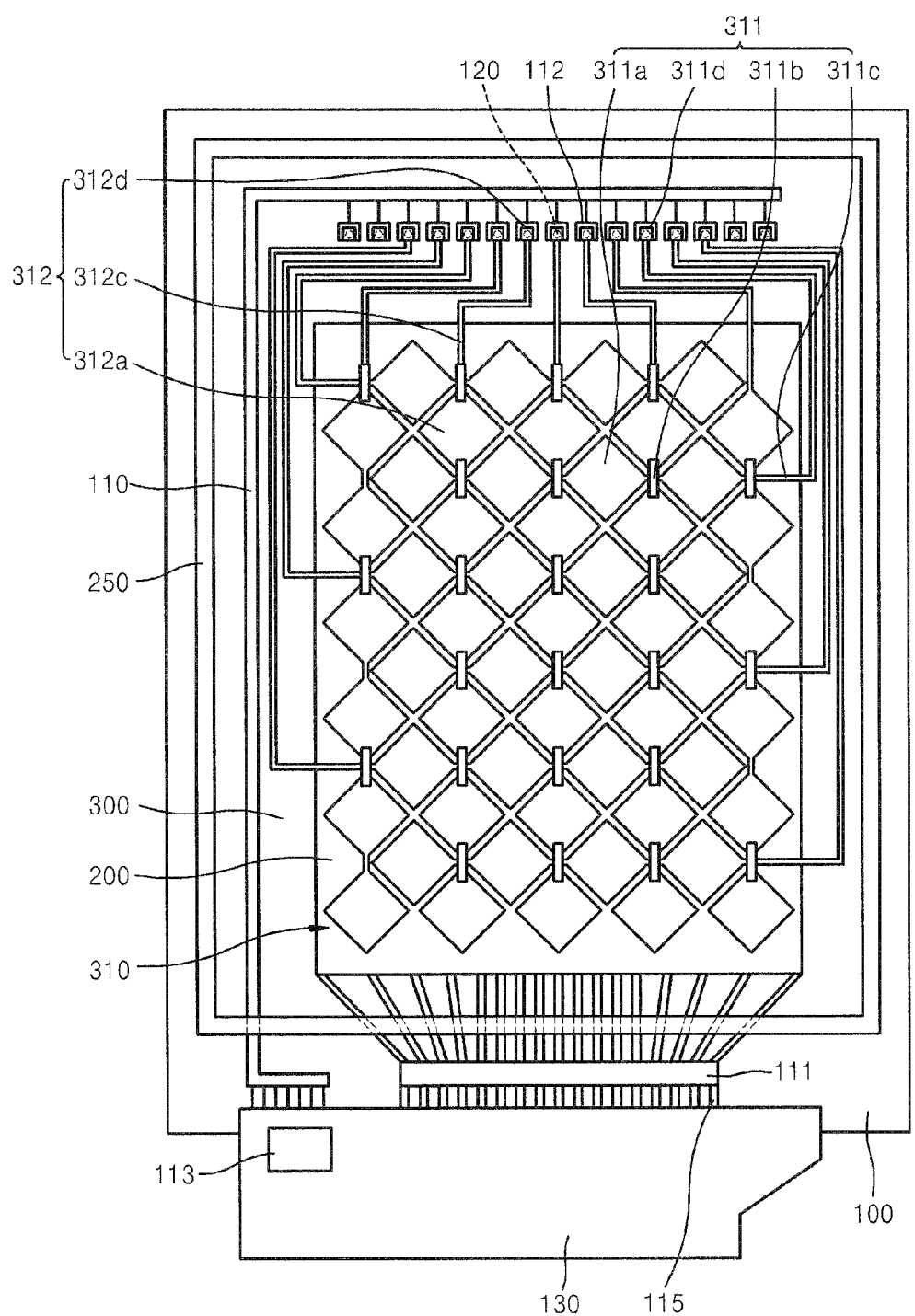
FIG. 4 is a detailed plan schematic view of the organic light emitting display device of FIG. 1.

FIG. 4 is a detailed plan schematic view of the organic light emitting display device of FIG. 1, and FIG. 5 is a cross-sectional view of the organic light emitting display device of FIG. 4.

Referring to FIGS. 4 and 5, a contact unit 311d of a first direction pattern unit 311, and a contact unit 312d of a second direction pattern unit 312, which are formed on an encapsulation substrate 300, are electrically connected to a data line 110 formed on the substrate 100. To make this connection, the organic light emitting display device according to one embodiment of the present invention includes a conductive member 120.

To be more specific, a display unit 200 for displaying an image is formed above the substrate 100 (the display unit 200 will be described later in more detail with reference to FIG. 6). A flexible PCB 130, on which various suitable electrical components for driving and controlling the display unit 200 are disposed, is arranged with the display unit 200. A display drive integrated circuit (DDI) 111 is arranged between the display unit 200 and the flexible PCB 130 to drive the display unit 200. The DDI 111 and the flexible PCB 130 may be connected by a plurality of input/output lines 115.

The data line 110 is formed around the display unit 200 and above the substrate 100. The data line 110 is used to deliver electrical signals, which are generated by the first and second pattern layers (310 and 320) formed on the inner surface of the encapsulation substrate 300, to the flexible PCB 130. For delivery of these electrical signals, the data line 110 further includes a plurality of substrate contact units 112 located on the substrate (see FIG. 5).

The substrate contact units 112 are formed on the substrate at positions corresponding to positions of the contact units 311d of the first direction pattern units 311, and corresponding to positions of the contact units 312d of the second direction pattern unit 312. The substrate contact units 112 are formed on the substrate 100, and the contact units 311d and 312d are formed on the encapsulation substrate 300 and both are electrically connected by the conductive member 120. Various conductive materials including a silver paste may be used for the conductive member 120. The substrate contact units 112 are individually connected to data line 110 which is connected to the flexible PCB 130.

A touch panel drive IC (TDI) 113 configured to receive the electrical signals to drive and control the touch panel is disposed on the flexible PCB 130, where the electrical signals are generated by the first and second pattern layers 310 and 320 formed on the inner surface of the encapsulation substrate 300.

In this manner, the organic light emitting display device according to one embodiment of the present invention includes a conventional flexible PCB used in a display device to provide an integrated interface for enabling a touch panel function. By doing so, it is possible to effectively reduce manufacturing costs, and to improve the ease of manufacture and the user's convenience.

Also, referring to FIG. 4, the DDI 111 and the TDI 113 are shown to be separately arranged but the present invention is not limited thereto. That is, although not illustrated in the drawing, the DDI 111 may be implemented to include the functions of the TDI 113 in some embodiments. In this case, the data line 110 may be configured to be directly connected to the DDI 111. By doing so, it is possible to effectively further reduce the manufacturing costs, and to improve the manufacture and user's convenience.

Hereinafter, a structure of a display unit in the organic light emitting display device according to the first embodiment of the present invention will now be described in more detail.

Figure 6:
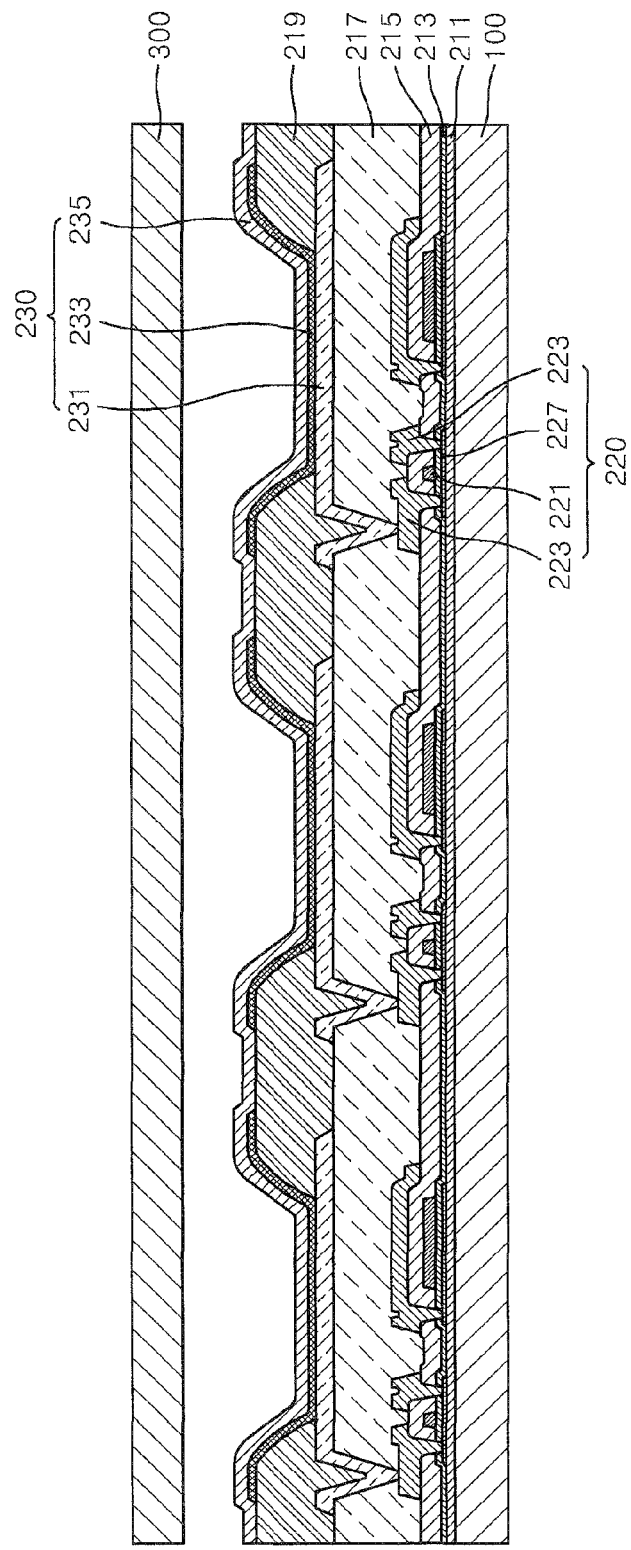
FIG. 6 is a cross-sectional schematic view of a portion of the organic light emitting display device of FIG. 1.

FIG. 6 is a cross-sectional view of a portion of the organic light emitting display device of FIG. 1, showing a detailed configuration of the display unit 200.

Referring to FIG. 6, a plurality of thin film transistors 220 are formed on (or with) the substrate 100, and an organic light emitting diode (OLED) 230 is formed on each of the thin film transistors 220. The OLED 230 includes a pixel electrode 231 electrically connected to the thin film transistor 220, a counter electrode 235 disposed entirely on the substrate 100, and an intermediate layer 233 disposed between the pixel electrode 231 and the counter electrode 235 that includes a light emitting layer.

The thin film transistors 220, each of which includes a gate electrode 221, source and drain electrodes 223, a semiconductor layer 227, a gate insulating layer 213, and an interlayer insulating layer 215, are formed on the substrate 100. The current embodiment is not limited to the thin film transistors 220 of FIG. 3D. Thus other thin film transistors such as an organic thin film transistor including a semiconductor layer formed of an organic material or a silicon thin film transistor formed of silicon may also be used. In some embodiments, a buffer layer 211 formed of a silicon oxide or a silicon nitride may be further included between the thin film transistors 220 and the substrate 100.

The OLED 230 includes the pixel electrode 231 and the counter electrode 235 which effectively face each other. The OLED further includes the intermediate layer 233 formed of an organic material and disposed between the pixel electrode 231 and the counter electrode 235. The intermediate layer 233, which includes the light emitting layer, may also include a plurality of layers.

The pixel electrode 231 functions as an anode electrode, and the counter 235 functions as a cathode electrode. However, the polarity of the pixel electrode 231 and the counter electrode 235 may be switched.

The pixel electrode 231 may be formed as a transparent electrode or a reflective electrode. When formed as a transparent electrode, the pixel electrode 231 may be formed of ITO, IZO, ZnO, and/or In2O3. When formed as a reflective electrode, the pixel electrode 231 may include a reflection layer formed of Ag, Mg, Al, Pt, Pd, Au, Ni, Nd, Ir, Cr or combinations thereof, and a layer including ITO, IZO, ZnO, and/or In2O3, formed on the reflection layer.

The counter electrode 235 may also be formed as a transparent electrode or a reflective electrode. When formed as a transparent electrode, the counter electrode 235 may include a layer in which Li, Ca, LiF/Ca, LiF/Al, Al, Mg, or combinations thereof, is deposited on the intermediate layer 233 between the pixel electrode 231 and the counter electrode 235. In some embodiments, the counter electrode layer may also include a bus electrode line and an auxiliary electrode formed of ITO, IZO, ZnO, and/or In2O3. When formed as a reflective electrode, the counter electrode 235 may be formed by depositing Li, Ca, LiF/Ca, LiF/Al, Al, Mg or combinations thereof.

A pixel defining layer (PDL) 219 is formed to cover an edge (or edge portion) of the pixel electrode 231 and to have a thickness (or a predetermined thickness) measured from the pixel electrode 231 to the counter electrode 235. The PDL 219 defines a light emitting region, and provides a wide gap between the edge of the pixel electrode 231 and the counter electrode 235 to prevent an electric field from being concentrated on the edge of the pixel electrode 231, and thereby preventing (or protecting from) a potential short circuit between the pixel electrode 231 and the counter electrode 235.

A plurality of intermediate layers 233 each including at least a light emitting layer, may be formed between each respective pixel electrode 231 and each respective counter electrode 235. In FIG. 6, the intermediate layer 233 may be formed of a low molecule organic material or a polymer organic material.

When formed of a low molecule organic material, the intermediate layer 233 may have a single-layer or multiple-layer structure in which a hole injection layer (HIL), a hole transport layer (HTL), an organic light emission layer (EML), an electron transport layer (ETL), and an electron injection layer (EIL) are stacked. Examples of the organic material include copper phthalocyanine (CuPc), N,N'-Di(naphthalene-1-yl)-N,N'-diphenyl-benzidine (NPB), tris-8-hydroxyquinoline aluminum (Alq3), etc. The low molecule organic material may be formed using a vacuum deposition method and a mask.

When formed of a polymer organic material, the intermediate layer 233 may have a structure formed of an HTL and an EML; the HTL may be formed of poly(3,4-ethylenedioxythiophene) (PEDOT), and the EML may be formed of polyphenylenevinylene (PPV) and polyfluorene.

The OLED 230 is electrically connected to the thin film transistor 220 disposed there below. When a planarization layer 217 covering the thin film transistor 220 is formed, the OLED 230 is disposed on top of the planarization layer 217, and the pixel electrode 231 is electrically connected to the thin film transistor 220 via contact holes formed in the planarization layer 217.

In the embodiment illustrated in FIG. 6, the OLED 230 formed on the substrate 100 is sealed by the encapsulation substrate 300. The encapsulation substrate 300 may be formed of various suitable materials such as glass or plastic, as described above. Also, as described above, pattern layers (refer to as the first pattern layer 310 and the second pattern layer 320 in FIG. 5), and insulating layers (refer to as the first insulating layer 330 and the second insulating layer 340 in FIG. 5) are sequentially formed on the inner surface of the encapsulation substrate 300, thereby making it possible to provide a touch panel function.

A method of driving the organic light emitting display device according to one embodiment of the present invention will now be briefly described.

Referring back to FIGS. 4 and 5, when a finger, a conductive object, or a high dielectric object approaches or touches a surface of the organic light emitting display device according to one embodiment of the present invention, the organic light emitting display device interprets a change of an electrostatic charge (capacitance) of conductors caused by such approach, thereby sensing a touch. Based on the touch, an output is generated that includes the coordinates of the touch on the surface, and the pressing value.

To be more specific, as a constant voltage, a cathode voltage flows in the counter electrode 235 (see FIG. 6) of the display unit 200 which contacts the second insulating layer 340. Thus, the first pattern layer 310 and the counter electrode 235 form one capacitor, and an electrostatic charge between the first pattern layer 310 and the counter electrode 235 is maintained constant. If a finger, a conductive object, or a high dielectric object approaches or touches a surface above the encapsulation substrate 300, the finger and the first pattern layer 310 form a second capacitor. These two capacitors are effectively connected in serial, and an entire electrostatic charge changes with a touch. By using the position where the change of the electrostatic charge occurs, and a magnitude of the change, a touch sensing system can sense a touch, including the magnitude, and locate the position of the touch.

Second Embodiment

Figure 7A:
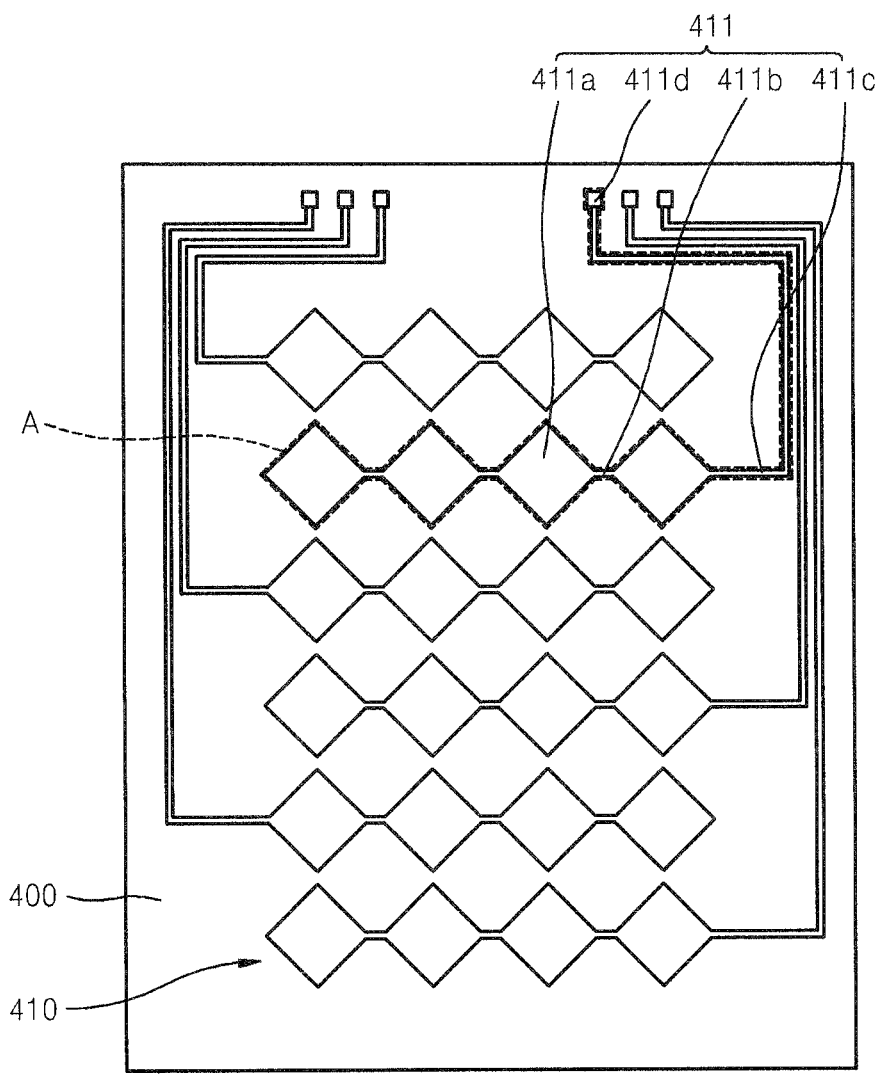
FIG. 7A is a bottom schematic view of an encapsulation substrate and a first pattern layer formed on a surface of the encapsulation substrate in an organic light emitting display device according to a second embodiment of the present invention.
Figure 7B:
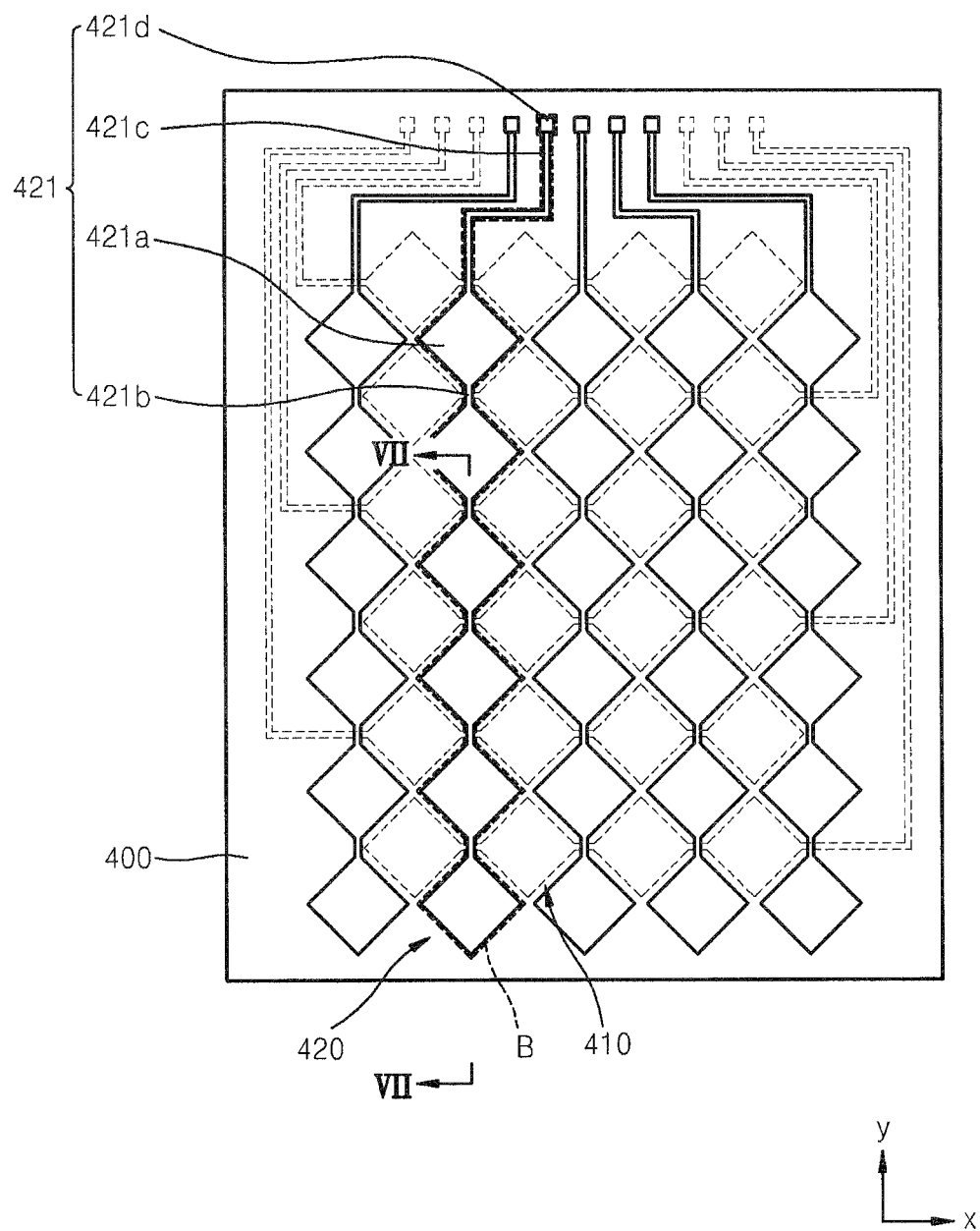
FIG. 7B is a bottom schematic view of the first pattern layer of FIG. 7A, and a second pattern layer on the first pattern layer.
Figure 7C:
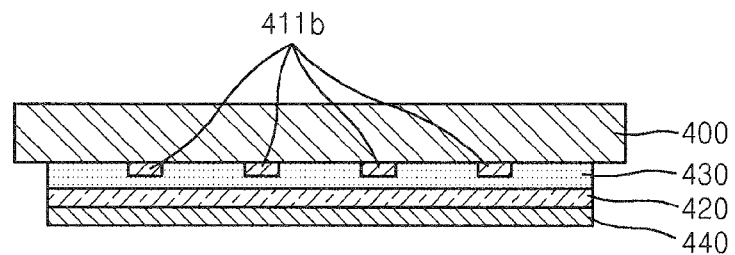
FIG. 7C is a cross-sectional schematic view taken along line VII-VII in FIG. 7B.
Figure 7D:
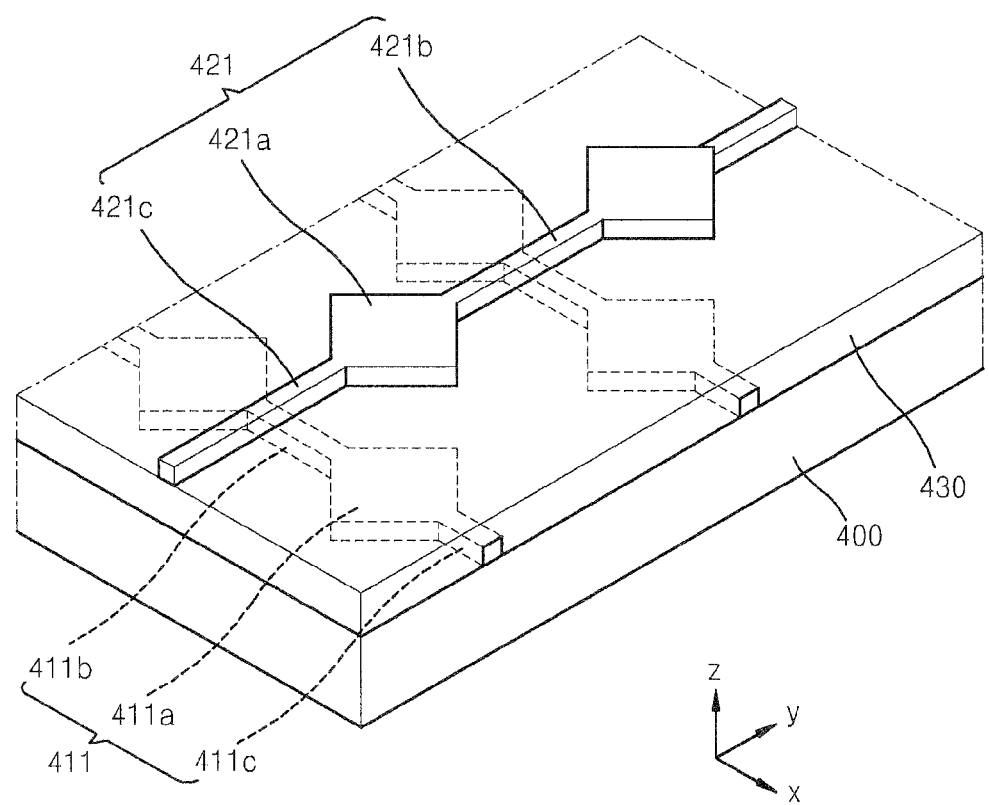
FIG. 7D is a bottom perspective schematic view of the first pattern layer and the second pattern layer of FIG. 7B.

FIG. 7A is a bottom schematic view of an encapsulation substrate and a first pattern layer formed on a surface of the encapsulation substrate in an organic light emitting display device according to a second embodiment of the present invention. FIG. 7B is a bottom view of the first pattern layer of FIG. 7A, and a second pattern layer on the first pattern layer. FIG. 7C is a cross-sectional schematic view taken along line VII-VII in FIG. 7B. FIG. 7D is a bottom perspective schematic view of the first pattern layer and the second pattern layer of FIG. 7B.

Referring to FIGS. 7A through 7D, a first pattern layer 410, a first insulating layer 430, a second pattern layer 420, and a second insulating layer 440 are sequentially formed on a surface of an encapsulation substrate 400, respectively, to face a substrate.

In the embodiment illustrated in FIGS. 7A through 7D, the first and second direction pattern units are not formed using a single pattern layer. Instead, the first direction pattern units 411 are formed using the first pattern layer 410, while the second direction pattern units 421 are formed using the second pattern layer 420.

To be more specific, the first pattern layer 410 is formed on the surface of the encapsulation substrate 400 to face the substrate 100 (see FIG. 1). The first pattern layer 410 includes a plurality of first direction pattern units 411 formed in parallel rows along a first direction (the X direction in FIG. 7A). Reference character A illustrated in FIG. 7A refers to one row of first direction pattern units 411. As illustrated in FIG. 7A, the first direction pattern units 411 are formed in parallel rows. Here, in a number of embodiments, the pattern units (411 and 421) are used as sensors (or sensor pads).

Reference character A in FIG. 7A, refers to one row of first direction pattern units 411, where each row of first direction pattern units 411 includes a plurality of main bodies 411a, a plurality of connecting units 411b, an extending unit 411c, and a contact unit 411d. The main bodies 411a have a diamond shape, and are formed in parallel rows along the first direction, i.e., the X direction in FIG. 7A. The connecting units 411b are formed between each of the main bodies 411a, thereby connecting the main bodies 411a which are adjacent to each other. The extending unit 411c extends from an end of each of the first direction pattern units 411. The extending unit 411c may be formed to extend in a direction, e.g., a Y direction in FIG. 7A, so that a plurality of extending units 411c may be arranged at one end of the encapsulation substrate 400, that is, an upper end of the encapsulation substrate 400 in FIG. 7A. The contact unit 411d is formed at an end of the extending unit 411c, and is electrically connected to a substrate contact unit of the data line of the substrate via a conductive member.

Referring to FIGS. 7C and 7D, the first insulating layer 430 is formed on the surface of the encapsulation substrate 400 to face the substrate and to cover the first pattern layer 410. The first insulating layer 430 insulates the first pattern layer 410 from the second pattern layer 420.

As illustrated in FIGS. 7B through 7D, the second pattern layer 420 is formed on top of the first insulating layer 430 to face the substrate 100 (see FIG. 1).

To be more specific, the second pattern layer 420 includes the second direction pattern units 421 formed in parallel columns along a second direction (the Y direction in FIG. 7B). Reference character B illustrated in FIG. 7B indicates one column of second direction pattern units 421. As illustrated in FIG. 7B, the second direction pattern units 421 are formed in parallel columns. In FIG. 7B, dashed or hidden lines indicate the first pattern layer 410 illustrated in FIG. 7A.

In FIG. 7B, reference character B refers to one column of second direction pattern units 421. Each column of second direction pattern units 421 includes a plurality of main bodies 421a, an extending unit 421c, and a contact unit 421d. The main bodies 421a have a diamond shape, and are formed in a column along the second direction, i.e., the Y direction in FIG. 7B. The connecting units 421b are formed between each of the main bodies 421a, thereby connecting the main bodies 421a which are adjacent to each other. The extending unit 421c extends from an end of each of the second direction pattern units 421. The extending unit 421c may be formed to extend in a direction, e.g., the Y direction in FIG. 7B, so that a plurality of extending units 421c may be arranged at one end of the encapsulation substrate 400, that is, an upper end of the encapsulation substrate 400 in FIG. 7B. The contact unit 421d is formed at an end of the extending unit 421c, and is electrically connected to a substrate of the data line of the substrate via the conductive member.

The first pattern layer 410 and the second pattern layer 420 may be formed of transparent materials such as ITO, IZO, ZnO, or In2O3. Also, the first pattern layer 410 and the second pattern layer 420 may be formed by using a photolithography process. That is, an ITO layer formed by using a deposition method, a spin coating method, a sputtering method, and/or an inkjet method may be used to form the first pattern layer 410 and the second pattern layer 420.

Referring now to FIG. 7C, a second insulating layer 440 is formed on both the first insulating layer 430 to face the substrate and on the second pattern layer 420. An opposite side of the second insulating layer 440 faces (e.g., abuts) the display unit. The second insulating layer 440 insulates the second pattern layer 420 from a display unit 200 (see FIG. 5).

In this manner, according to the embodiments of the present invention, it is possible to provide a display panel with a touch panel function without increasing the thickness of the display panel. Also, because an electrostatic capacitive pattern is formed on an inner surface of the encapsulation substrate, slim (or thin) etching is possible.

Third Embodiment

Figure 8A:
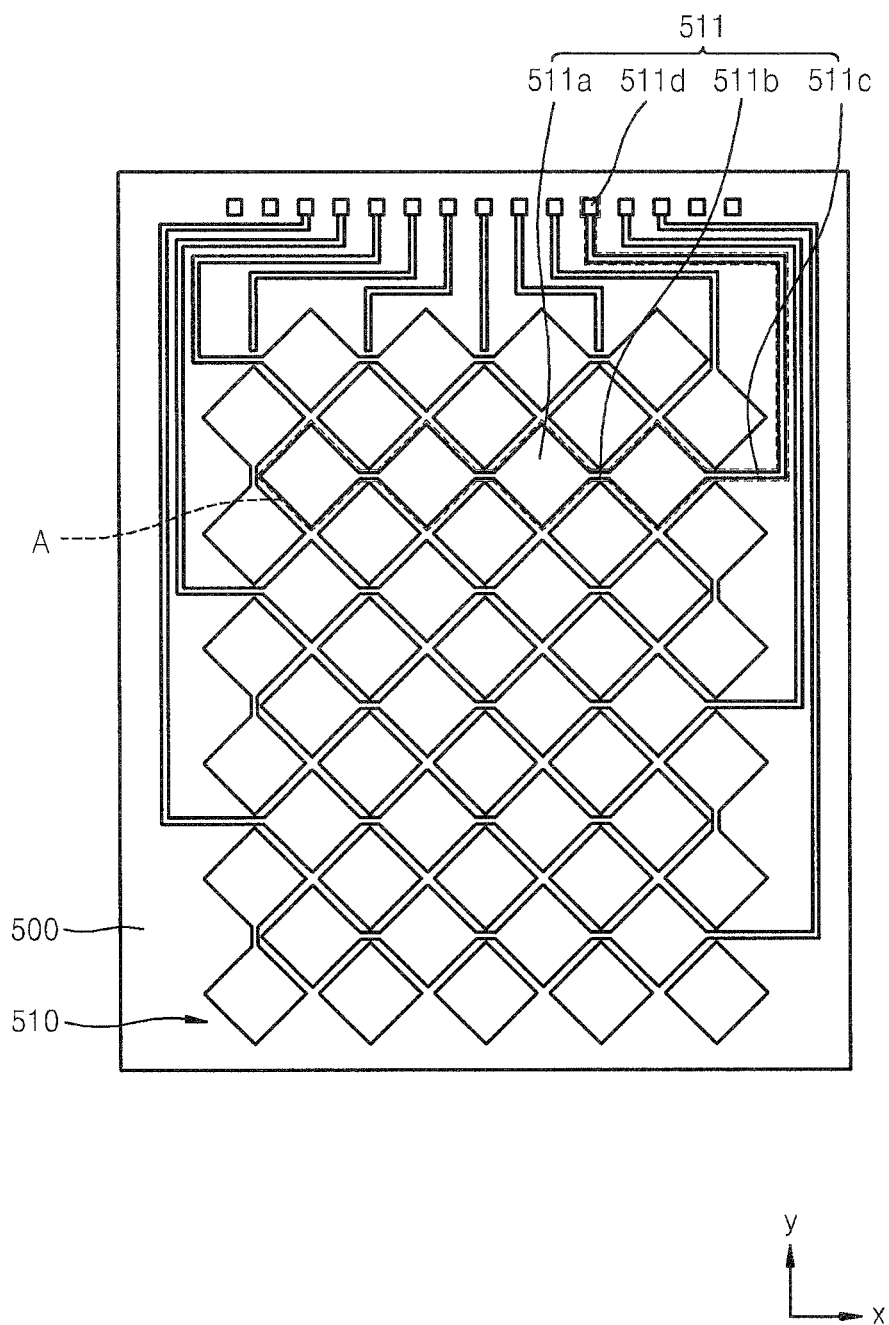
FIGS. 8A and 8B are plan schematic views of an encapsulation substrate and a first pattern layer formed on a surface of the encapsulation substrate in an organic light emitting display device according to a third embodiment of the present invention.
Figure 8B:
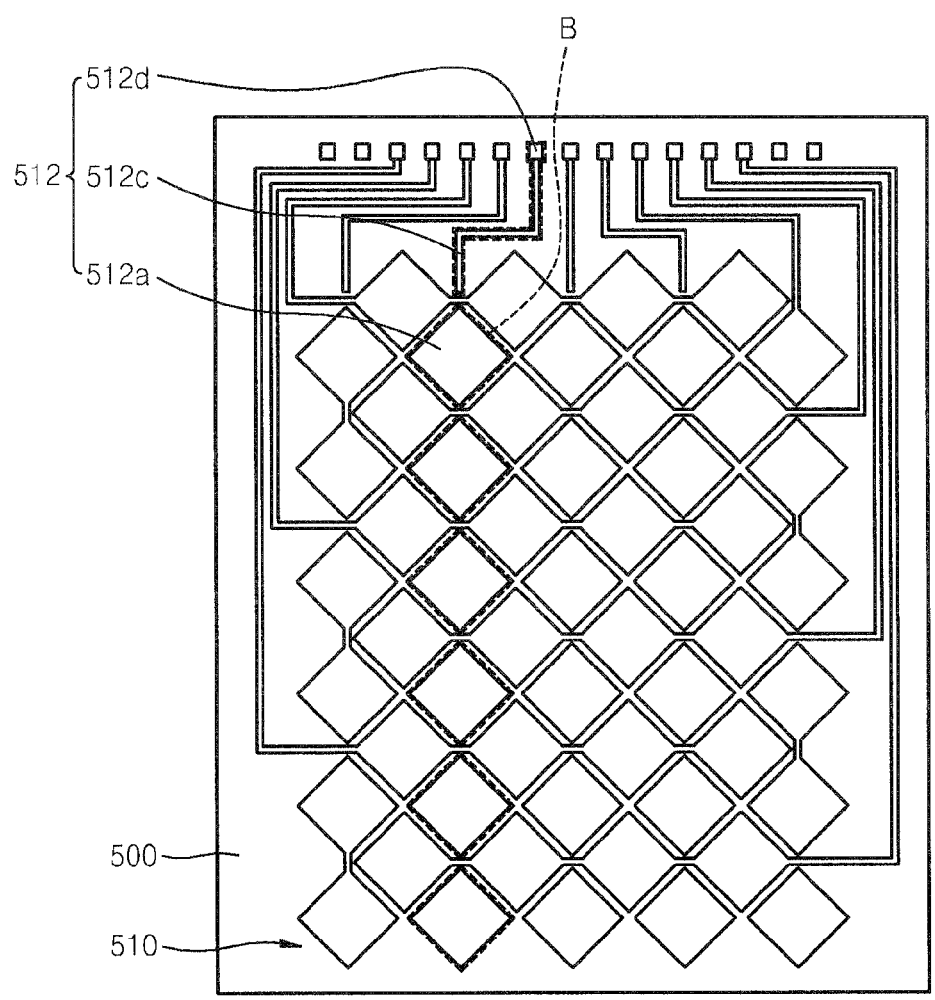
Figure 8B:
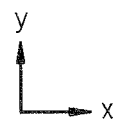
Figure 8C:
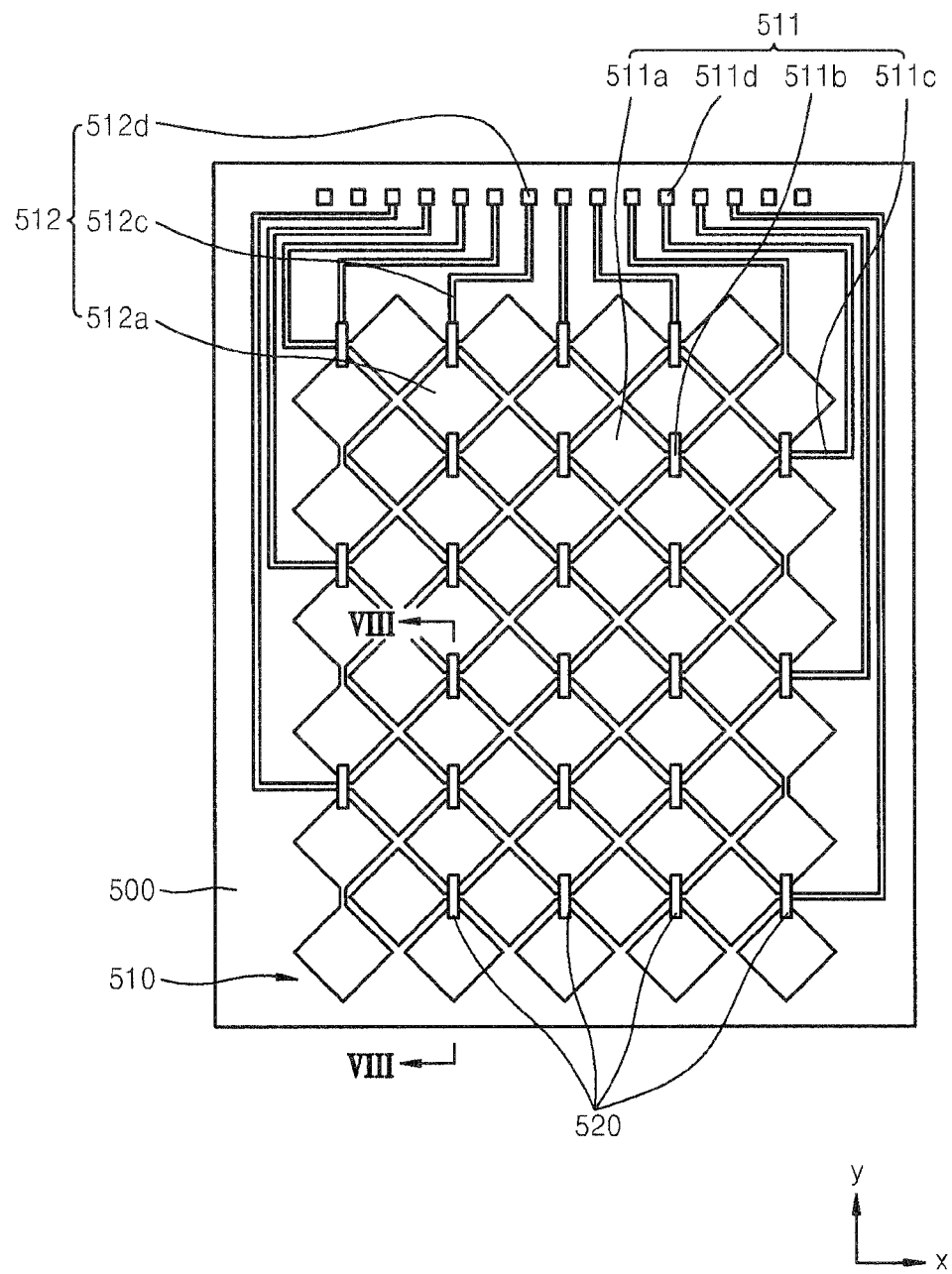
FIG. 8C is a plan schematic view of the first pattern layer of FIG. 8A, and a second pattern layer on the first pattern layer.
Figure 8D:
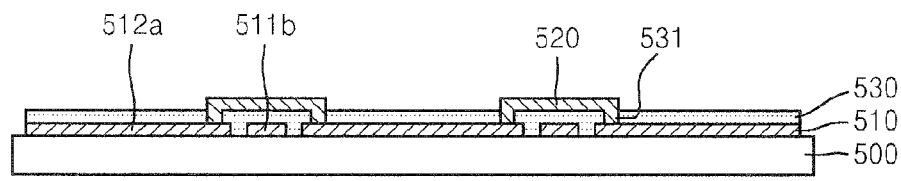
FIG. 8D is a cross-sectional schematic view taken along line VIII-VIII in FIG. 8C.
Figure 8E:
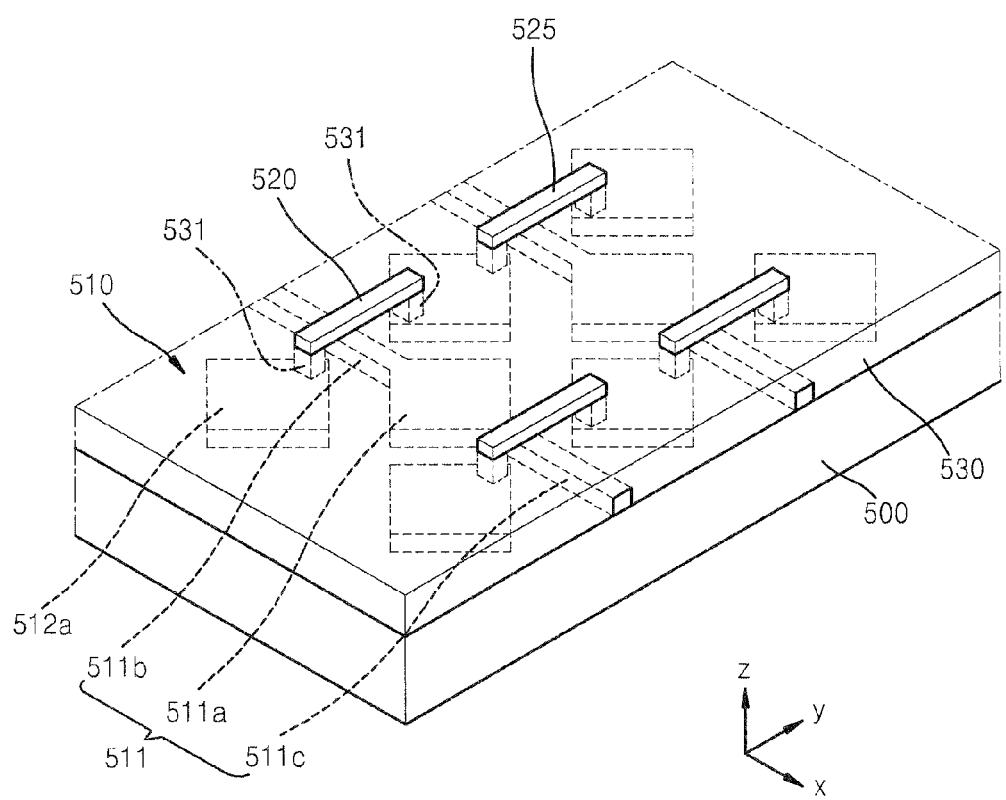
FIG. 8E is a plan perspective schematic view of the first pattern layer and the second pattern layer of FIG. 8C.

FIGS. 8A and 8B are plan (or top) schematic views of an encapsulation substrate 500 and a first pattern layer formed on a surface of the encapsulation substrate 500 in an organic light emitting display device according to a third embodiment of the present invention. FIG. 8C is a plan (or top) schematic view of the first pattern layer of FIGS. 8A and 8B, and a second pattern layer on the first pattern layer. FIG. 8D is a cross-sectional schematic view taken along line VIII-VIII in FIG. 8C. FIG. 8E is a plan (or top) perspective schematic view of the first pattern layer and the second pattern layer of FIG. 8C.

Figure 10:
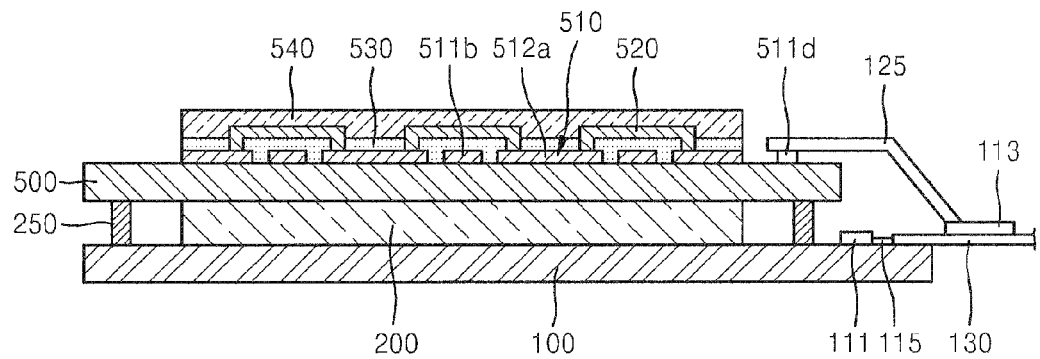
FIG. 10 is a cross-sectional schematic view of the organic light emitting display device of FIG. 9.

Referring to FIGS. 8A through 8E, a first pattern layer 510, a first insulating layer 530, a second pattern layer 520, and a second insulating layer 540 are sequentially formed on a first side or surface (i.e., a top surface) of the encapsulation substrate 500, respective, to face away from a display unit 200 (see FIG. 10). Here, the encapsulating substrate 500 also has a second side or surface (i.e., a bottom surface) that faces the display unit 200 (see FIG. 10).

To be more specific, the first pattern layer 510 is formed on the top surface of the encapsulation substrate 500. The first pattern layer 510 includes a plurality of first direction pattern units 511 formed in parallel rows along a first direction (the X direction in FIG. 8A), and a plurality of second direction pattern units 512 formed in parallel columns along a second direction (the Y direction in FIG. 8B) that crosses (or is substantially perpendicular to) the first direction. As illustrated in FIGS. 8A and 8B, the first direction pattern units 511 and the second direction pattern units 512 are alternately disposed. That is, the first direction pattern units 511, each having a square shaped body rotated 45 degrees like a baseball diamond, are formed in parallel rows where horizontally opposite corners of each diamond are adjacent and coupled along the first direction (the X direction in FIG. 8A) on the surface of the encapsulation substrate 500. Similarly, the second direction pattern units 512, each having a square shaped body rotated 45 degrees like a baseball diamond, are formed in parallel columns where vertically opposite corners of each diamond are adjacent and coupled along the second direction (the Y direction in FIG. 8B) between each of the first direction pattern units 511. Here, in a number of embodiments, the patterns units (511 and 512) are utilized as sensors (or sensor pads).

Reference character A refers to one row of first direction pattern units 511 of FIG. 8A, where each row of first direction pattern units 511 includes a plurality of main bodies 511a, a plurality of connecting units 511b, an extending unit 511c, and a contact unit 511d.

The main bodies 511a have a diamond shape, and are formed in a row along the first direction, i.e., the X direction in FIG. 8A. The connecting units 511b are formed between each of the main bodies 511a, and respectively connect the main bodies 511a that are adjacent to each other. The extending unit 511c extends from an end of each of the first direction pattern units 511. The extending unit 511c may be formed to extend in a direction, e.g., the Y direction in FIG. 8A, so that the plurality of extending units 511c may be arranged at one end (or end portion) of the encapsulation substrate 500, that is, an upper end of the encapsulation substrate 500 in FIG. 8A. The contact unit 511d is formed at an end (or upper end portion) of the extending unit 511c, and is electrically connected to a substrate contact unit 112 of a flexible printed circuit board (PCB) 130 (see FIG. 10) via a connector 125 (see FIG. 10) to be described in more detail later.

In FIG. 8B, reference character B refers to one column of second direction pattern units 512. Each column of second direction pattern units 512 includes a plurality of main bodies 512a, an extending unit 512c, and a contact unit 512d. The main bodies 512a have a diamond shape, and are formed in a row along the second direction, i.e., the Y direction in FIG. 8B.

Here, unlike the first direction pattern units 511, none of the second direction pattern units 512 includes a connecting unit. The main bodies 512a are connected to each other not by a connecting unit but by the second pattern layer 520 having, e.g., a plurality of third pattern units 325 for connecting the main bodies 512a to each other (see FIG. 8E).

The extending unit 512c extends from a contact unit 512d to a point in close proximity to a corner of a diamond shaped main body 512a closes to an upper end of the encapsulation substrate 500. The extending unit 512c may be formed to extend in a direction, e.g., the Y direction in FIG. 8B, so that a plurality of extending units 812c may be arranged at one end of the encapsulation substrate 500, that is, an upper end of the encapsulation substrate 500 in FIG. 8B. The contact unit 512d is formed at an end of the extending unit 512c, and is electrically connected to a substrate contact unit of the flexible PCB 130 (see FIG. 10) via the connector 125 (see FIG. 10) to be described in more detail later.

Referring to FIGS. 8D and 8E, the first insulating layer 530 is formed on the top surface of the encapsulation substrate 500 such that it covers the first pattern layer 510. The first insulating layer 530 insulates the first pattern layer 510 from the second pattern layer 520. A plurality of contact holes 531 may be formed at set or predetermined positions in the first insulating layer 530, e.g., at positions that correspond to adjacent corners of the diamond shaped main bodies 512a of the second direction pattern units 512. The second pattern layer 520 and the main bodies 512a of the second direction pattern units 512 are electrically connected via the contact holes 531.

As illustrated in FIGS. 8C through 8E, the second pattern layer 520 is formed on a top surface of the first insulating layer 530. The second pattern layer 520, a conductive layer, is formed such that it fills the contact holes 531 of the first insulating layer 530, thereby electrically connecting (e.g., by vias and third pattern units 525) the main bodies 512a of second direction pattern units 512 via the contact holes 531 and the third pattern units 525, that are adjacent to each other.

In this manner, the first direction pattern units 511 and the second direction pattern units 512, which are alternately disposed, do not intersect (or electrically couple) each other, so that a short circuit between the first direction pattern units 511 and the second direction pattern units 512 is prevented.

The first pattern layer 510 and the second pattern layer 520 may be formed of suitable transparent materials such as ITO, IZO, ZnO, and/or $In_2O_3$. Also, the first pattern layer 510 and the second pattern layer 520 may be formed by using a photolithography process. That is, an ITO layer formed by using a suitable deposition method, a spin coating method, a sputtering method, or an inkjet method may be used to form the first pattern layer 510 and the second pattern layer 520.

Referring now to FIG. 10, a second insulating layer 540 is formed on the top surface of the first insulating layer 530 to cover the second pattern layer 520. The second insulating layer 540 functions to protect the second pattern layer 520.

In this manner, according to the third embodiment of the present invention, it is possible to realize a touch panel function without substantially increasing the thickness of a display device. Also, because an electrostatic capacitive pattern is formed on an outer surface of the encapsulation substrate 500, slim (or thin) etching can be possible on an inner surface of the encapsulation substrate 500.

Hereinafter, the connection relationship between a pattern layer of an encapsulation substrate, and a printed circuit board (PCB) of a substrate will now be described in more detail.

Figure 9:
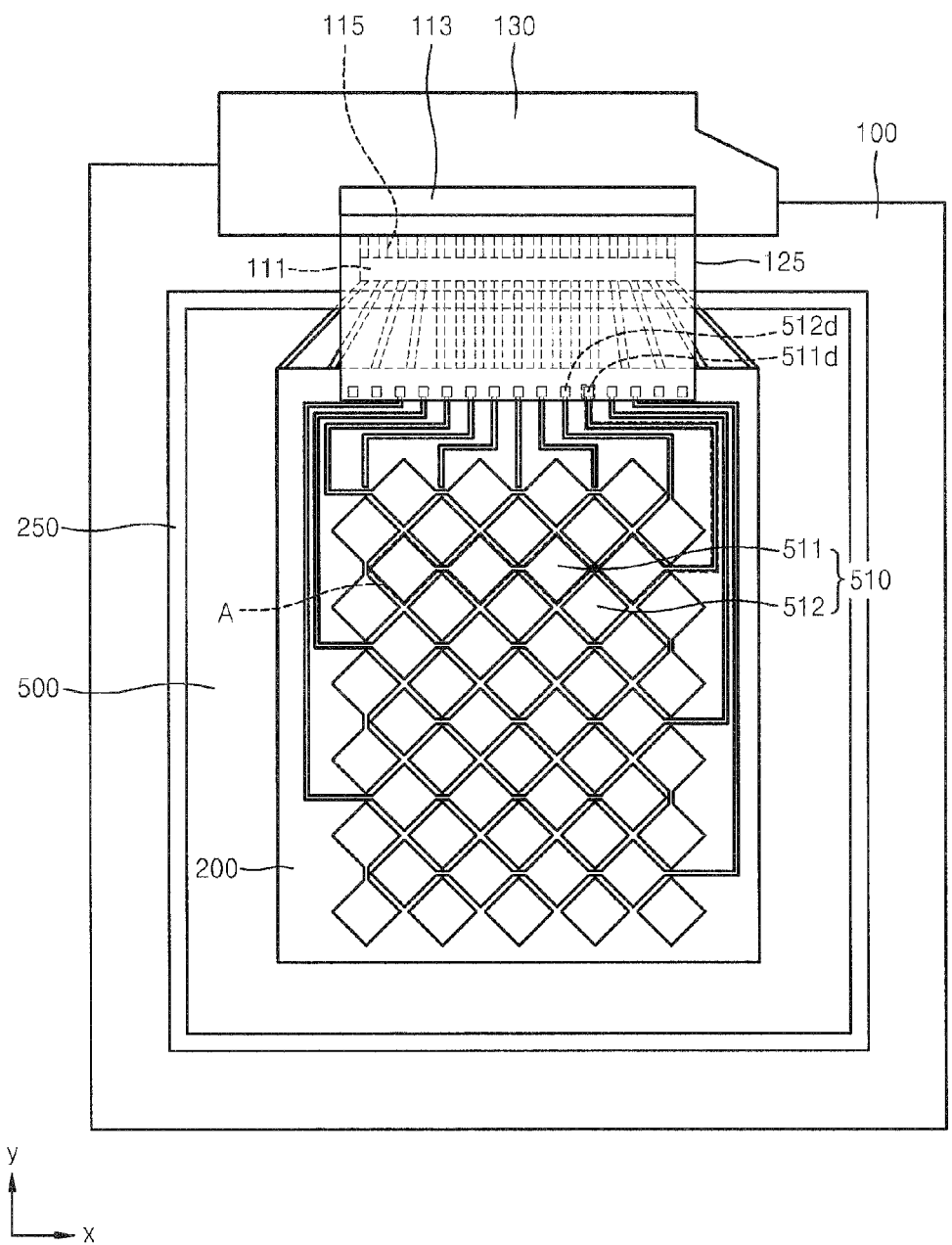
FIG. 9 is a detailed plan schematic view of the organic light emitting display device of FIG. 8A.

FIG. 9 is a detailed plan schematic view of the organic light emitting display device of FIG. 8A according to the third embodiment of the present invention, and FIG. 10 is a cross-sectional schematic view of the organic light emitting display device of FIG. 9.

Referring to FIGS. 9 and 10, a contact unit 511d of a first direction pattern unit 511, and a contact unit 512d of a second direction pattern unit 512, which are formed on an encapsulation substrate 500, are electrically connected to a touch panel drive integrated circuit (TDI) 113 that is formed on a flexible PCB 130. To make this connection, the organic light emitting display device according to the third embodiment of the present invention includes a connector 125 between the contact units 511d and 512d and the TDI 113.

To be more specific, a display unit 200 for displaying an image is formed above a substrate 100. The flexible PCB 130, on which various suitable electrical components for driving and controlling the display unit 200 are disposed, is arranged with (or aside) the display unit 200.

A display drive integrated circuit (DDI) 111 is arranged between the display unit 200 and the flexible PCB 130 to drive the display unit 200. The DDI 111 and the flexible PCB 130 may be connected by a plurality of input/output lines 115.

The connector 125 functions to deliver electrical signals, which are generated by the first and second pattern layers (510 and 520) formed on the outer surface of the encapsulation substrate 500, to the flexible PCB 130. To be more specific, an end of the connector 125 is formed as a contact to be electrically connected to the contact units 511d of the first direction pattern units 511 and the contact unit 512d of the second direction pattern units 512, which are formed on the encapsulation substrate 500. The other end of the connector 125 is configured to be electrically connected to the TDI 113 that is formed on the flexible PCB 130. In addition, it may be possible to form the connector 125 as a flexible substrate and then to dispose the TDI 113 on the connector 125. Here, as the connector 125, various suitable materials such as a FPCB may be used. The TDI 113 receives the electrical signals, which are generated by the first and second pattern layers 510 and 520 formed on the outer surface of the encapsulation substrate 500, to drive and control the touch panel.

In this manner, the organic light emitting display device according to the third embodiment of the present invention includes a conventional flexible PCB used in a display device to provide an integrated interface for enabling a touch panel function. By doing so, it is possible to effectively reduce manufacturing costs, and to improve the ease of manufacture and the user's convenience.

Also, referring to FIG. 10, the DDI 111 and the TDI 113 are shown to be separately arranged but the present invention is not limited thereto. That is, although not illustrated in the drawing, the DDI 111 may be implemented to include the functions of the TDI 113 in some embodiments. By doing so, it is possible to effectively further reduce the manufacturing costs, and to improve the manufacture and user's convenience.

Fourth Embodiment

Figure 11A:
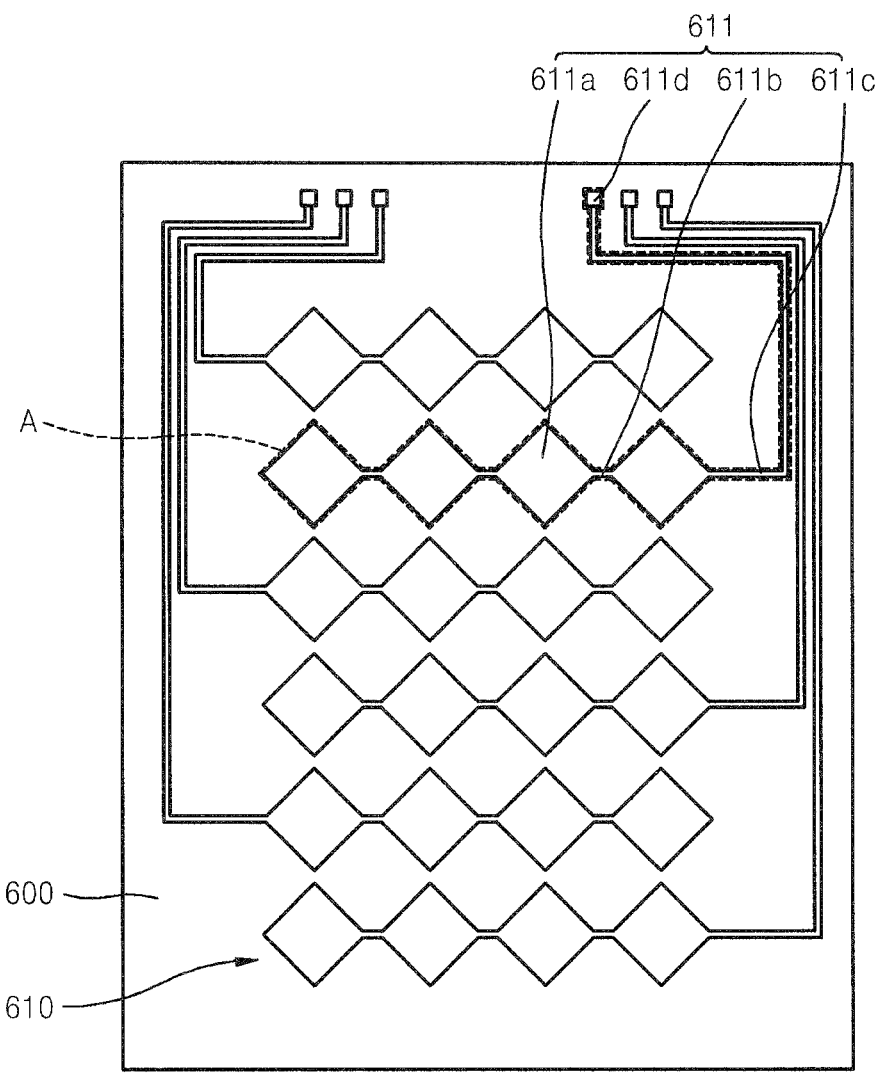
FIG. 11A is a plan schematic view of an encapsulation substrate and a first pattern layer formed on a surface of the encapsulation substrate in an organic light emitting display device according to a fourth embodiment of the present invention.
Figure 11B:
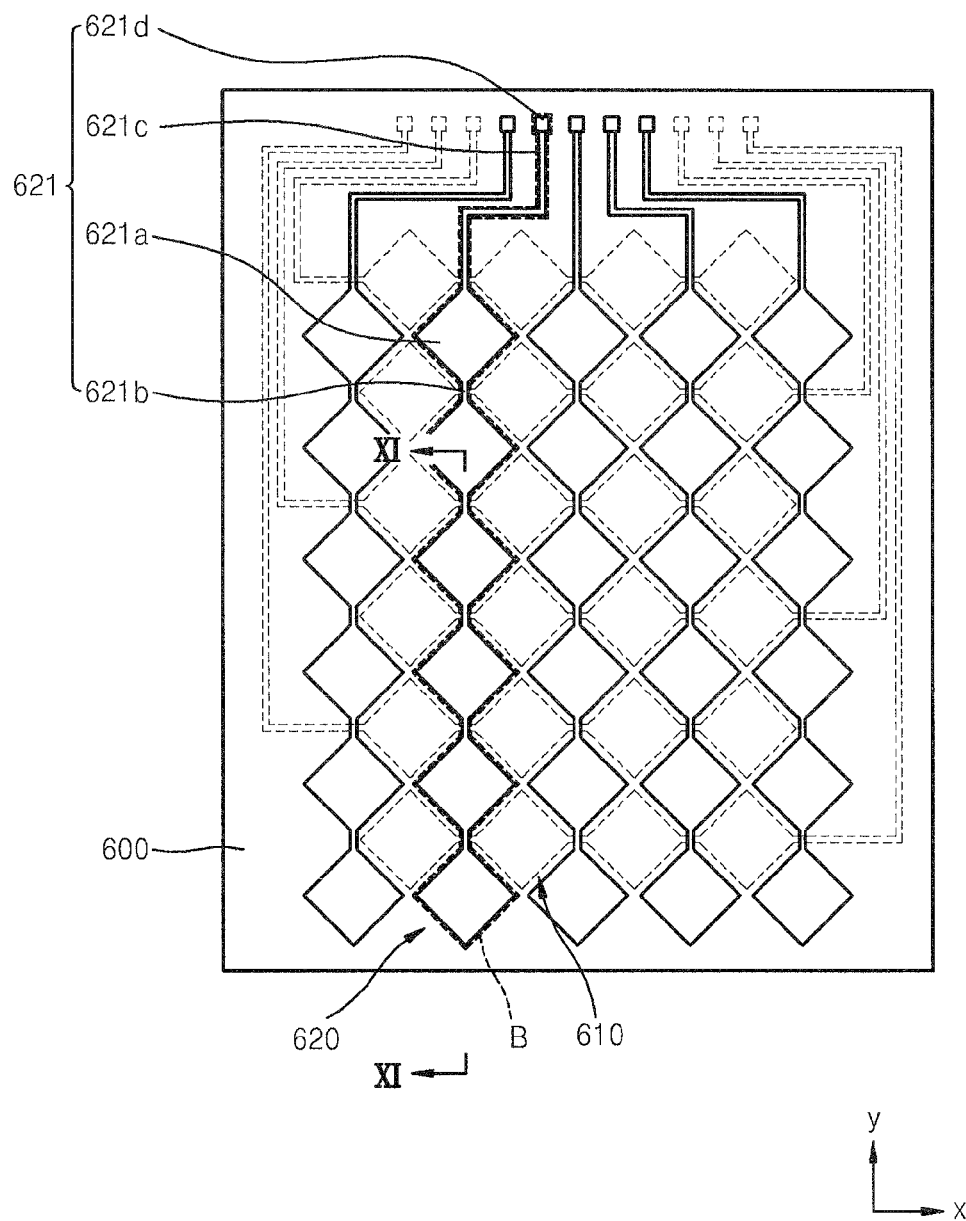
FIG. 11B is a bottom schematic view of the first pattern layer of FIG. 11A, and a second pattern layer on the first pattern layer.
Figure 11C:
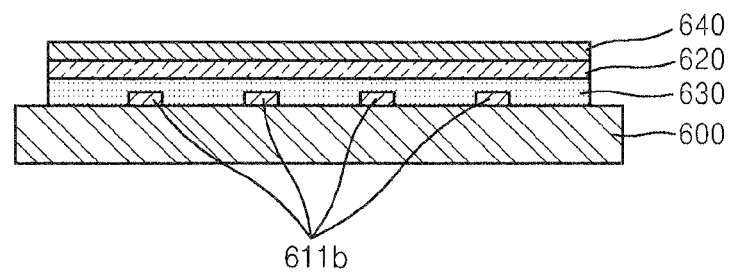
FIG. 11C is a cross-sectional schematic view taken along line XI-XI in FIG. 11B.
Figure 11D:
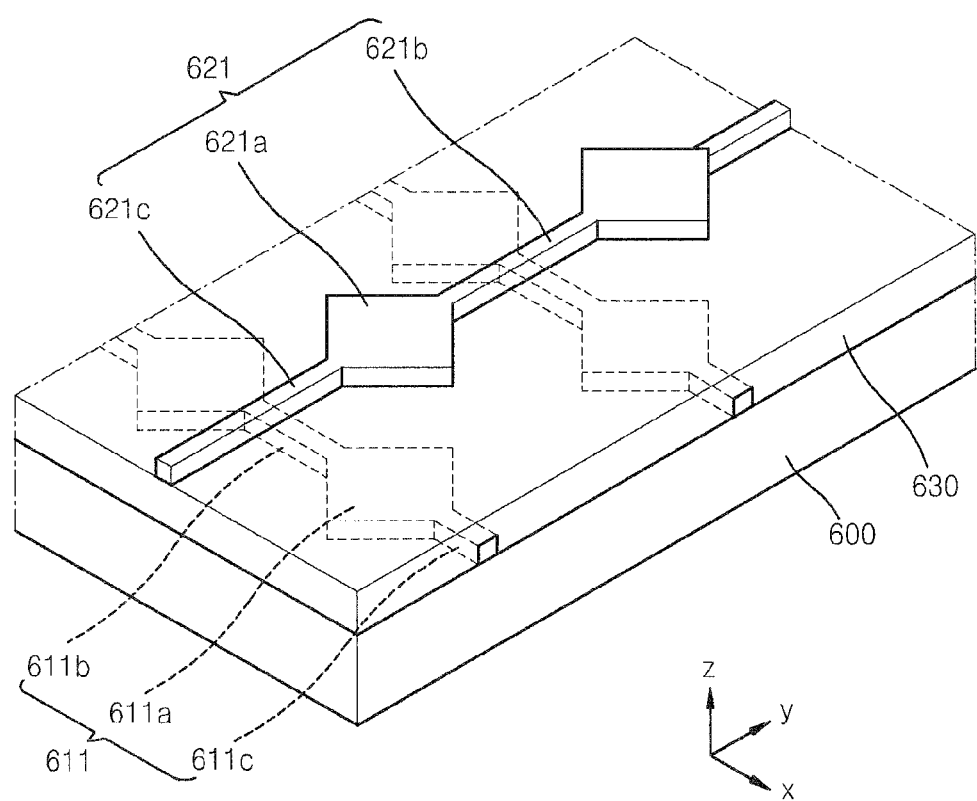
FIG. 11D is a bottom perspective schematic view of the first pattern layer and the second pattern layer of FIG. 11A.

FIG. 11A is a plan (or top) schematic view of an encapsulation substrate 600 and a first pattern layer formed on a surface of the encapsulation substrate 600 in an organic light emitting display device according to a fourth embodiment of the present invention. FIG. 11B is a bottom schematic view of the first pattern layer of FIG. 11A, and a second pattern layer on top of the first pattern layer. FIG. 11C is a cross-sectional schematic view taken along line XI-XI in FIG. 11B. FIG. 11D is a bottom perspective schematic view of the first pattern layer and the second pattern layer of FIG. 11A.

Referring to FIGS. 11A through 11D, a first pattern layer 610, a first insulating layer 630, a second pattern layer 620, and a second insulating layer 640 are sequentially formed on a side or surface (i.e., a top surface) of the encapsulation substrate 600 whose bottom side or bottom surface faces a display unit.

In the embodiment illustrated in FIGS. 11A through 11D, the first and second direction pattern units 611 and 621 are not formed using a single pattern layer. Instead, the first direction pattern units 611 are formed using the first pattern layer 610, while the second direction pattern units 621 are formed using the second pattern layer 620.

To be more specific, the first pattern layer 610 is formed on the surface of the encapsulation substrate 600 to face a substrate (e.g., the substrate 100 in FIG. 1). The first pattern layer 610 includes the plurality of first direction pattern units 611 formed in parallel rows along a first direction (the X direction in FIG. 11A). Reference character A illustrated in FIG. 11A refers to one row of first direction pattern units 611. As illustrated in FIG. 11A, the first direction pattern units 611 are formed in parallel rows. Here, in a number of embodiments, the pattern units (611 and 621) are used as sensors (or sensor pads).

Reference character A in FIG. 11A, refers to one row of the first direction pattern units 411, where each row of first direction pattern units 611 includes a plurality of main bodies 611a, a plurality of connecting units 611b, an extending unit 611c, and a contact unit 611d. The main bodies 611a have a diamond shape, and are formed in parallel rows along the first direction, i.e., the X direction in FIG. 11A. The connecting units 611b are formed between each of the main bodies 611a, thereby connecting the main bodies 611a which are adjacent to each other. The extending unit 611c extends from an end of each of the first direction pattern units 611. The extending unit 611c may be formed to extend in a direction, e.g., a Y direction in FIG. 11A, so that a plurality of extending units 611c may be arranged at one end of the encapsulation substrate 600, that is, an upper end of the encapsulation substrate 600 in FIG. 11A. The contact unit 611d is formed at an end of the extending unit 611c, and is electrically connected to a flexible PCB via a connector.

Referring to FIGS. 11C and 11D, the first insulating layer 630 is formed on the top surface of the encapsulation substrate 600 to cover the first pattern layer 610. The first insulating layer 630 insulates the first pattern layer 610 from the second pattern layer 620.

As illustrated in FIGS. 11B through 11D, the second pattern layer 620 is formed on a top surface of the first insulating layer 630.

To be more specific, the second pattern layer 620 includes the second direction pattern units 621 formed in parallel columns along the second direction (the Y direction in FIG. 11B). Reference character B illustrated in FIG. 11B indicates one column of second direction pattern units 621. As illustrated in FIG. 11B, the second direction pattern units 621 are formed in parallel columns. In FIG. 11B, dashed or hidden lines indicate the first pattern layer 610 illustrated in FIG. 11A.

In FIG. 11B, reference character B refers to one column of second direction pattern units 421. Each column of second direction pattern units 621 includes a plurality of main bodies 621a, a plurality of connecting units 621b, an extending unit 621c, and a contact unit 621d. The main bodies 621a have a diamond shape, and are formed in a column along the second direction, i.e., the Y direction in FIG. 11B. The connecting units 621b are formed between each of the main bodies 621a, thereby connecting the main bodies 621a which are adjacent to each other. The extending unit 621c extends from an end of each of the second direction pattern units 621. The extending unit 621c may be formed to extend in a direction, e.g., the Y direction in FIG. 11B, so that a plurality of extending units 621c may be arranged at one end of the encapsulation substrate 600, that is, an upper end of the encapsulation substrate 600 in FIG. 11B. The contact unit 621d is formed at an end of the extending unit 621c, and is electrically connected to the flexible PCB via the connector. In addition, it may be possible to form the connector as a flexible substrate and then to dispose a TDI on the connector.

The first pattern layer 610 and the second pattern layer 620 may be formed of transparent materials such as ITO, IZO, ZnO, or $In_2O_3$. Also, the first pattern layer 610 and the second pattern layer 620 may be formed by using a photolithography process. That is, an ITO layer formed by using a deposition method, a spin coating method, a sputtering method, and/or an inkjet method may be used to form the first pattern layer 610 and the second pattern layer 620.

Referring now to FIG. 11C, a second insulating layer 640 is formed on the top surface of the first insulating layer 630 to cover the second pattern layer 620. The second insulating layer 640 functions to protect the second pattern layer 620.

In this manner, according to the fourth embodiment of the present invention, it is possible to provide a display panel with a touch panel function without substantially increasing the thickness of the display panel. Also, because an electrostatic capacitive pattern is formed on an outer surface of the encapsulation substrate, slim (or thin) etching can be possible on an inner surface of the encapsulation substrate.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device comprising:
   a substrate;
   a display unit on the substrate;
   an encapsulation substrate having a first side facing the display unit, and a second side facing away from the display unit;
   a touch unit comprising a plurality of first sensors and a plurality of second sensors, the plurality of second sensors being on the second side, the plurality of first sensors being electrically coupled to each other and extending in parallel rows along a first direction, and the plurality of second sensors being electrically coupled to each other and extending in parallel columns along a second direction crossing the first direction;
   a first pattern layer on the second side of the encapsulation substrate and comprising the plurality of first and second sensors;
   an insulating layer on the first pattern layer; and
   a second pattern layer on the insulating layer, the second pattern layer comprising a plurality of pattern units separated and spaced apart from each other, each of the plurality of pattern units being formed to be connected to only corresponding two of the plurality of second sensors on the first pattern layer by penetrating the insulating layer at a first of the corresponding two of the plurality of second sensors, extending along the insulating layer, and penetrating the insulating layer at a second of the corresponding two of the plurality of second sensors,
   wherein the insulating layer comprises a first insulating layer and a second insulating layer, and
   the first pattern layer, the first insulating layer, the second pattern layer, and the second insulating layer are sequentially formed on the second side.

2. The organic light emitting display device of claim 1, wherein the plurality of first sensors and the plurality of second sensors are alternately arranged.

3. The organic light emitting display device of claim 1, wherein a protrusion unit of each of the plurality of first sensors in a plane parallel to the substrate is offset from a protrusion unit of each of the plurality of second sensors in the plane.

4. The organic light emitting display device of claim 1, further comprising a flexible printed circuit board (PCB) electrically coupled to the plurality of first sensors and the plurality of second sensors.

5. The organic light emitting display device of claim 4, further comprising a connector for delivering electrical signals generated by the touch unit to the flexible PCB,
   wherein the connector is electrically coupled to the plurality of first sensors and the plurality of second sensors.

6. The organic light emitting display device of claim 4, wherein the flexible PCB comprises a circuit for driving and controlling the display unit and the touch unit.

7. The organic light emitting display device of claim 1, wherein the display unit comprises:
   a thin film transistor (TFT) on the substrate; and
   an organic light emitting diode (OLED) electrically coupled to the TFT,
   wherein the OLED comprises a counter electrode, a pixel electrode, and an intermediate layer between the counter electrode and the pixel electrode.

8. The organic light emitting display device of claim 7, wherein the pixel electrode contacts a portion of the TFT, the intermediate layer contacts a portion of the pixel electrode, and the counter electrode contacts a portion of the intermediate layer.

9. The organic light emitting display device of claim 1, wherein the plurality of first sensors and the plurality of second sensors comprise indium tin oxide (ITO).

10. The organic light emitting display device of claim 1, wherein the plurality of first sensors and the plurality of second sensors are configured to generate electrical signals indicative of a touch.

11. The organic light emitting display device of claim 1, wherein each of the plurality of first sensors comprises a first diamond-shaped pad, and
    each of the plurality of second sensors comprises a second diamond-shaped pad at a position adjacent to one of the first diamond-shaped pads.

12. The organic light emitting display device of claim 1, wherein the first direction is perpendicular to the second direction.

13. The organic light emitting display device of claim 1, wherein the touch unit is an electrostatic capacitive type touch unit.

14. The organic light emitting display device of claim 1, wherein the second insulating layer on at least a portion of the second pattern layer.

15. The organic light emitting display device of claim 1, wherein the insulating layer has a plurality of contact holes, and the plurality of pattern units are electrically couple to the plurality of second sensors via the plurality of contact holes.

16. The organic light emitting display device of claim 15, wherein
    each of the plurality of first sensors comprises a first diamond-shaped pad,
    each of the plurality of second sensors comprises a second diamond-shaped pad at a position adjacent to one of the first diamond-shaped pads, and
    the plurality of contact holes are at positions corresponding to corners of the second diamond-shaped pads of the plurality of second sensors, where adjacent second sensors are coupled to each other.

17. The organic light emitting display device of claim 15, wherein the plurality of pattern units are configured to fill the plurality of contact holes to electrically couple the plurality of second sensors that are adjacent to each other on the first pattern layer.

18. The organic light emitting display device of claim 15, wherein each of the contacts holes contacts a corresponding one of the plurality of second sensors, and wherein each of the plurality of pattern units contacts corresponding two of the plurality of contact holes.

19. The organic light emitting display device of claim 15, wherein each of the plurality of pattern units comprises:
   a main portion on the insulation layer;
   a first fill portion in a corresponding one of the plurality of contact holes; and
   a second fill portion in another corresponding one of the plurality of contact holes.

20. The organic light emitting display device of claim 1, wherein the display unit comprises:
   a thin film transistor (TFT) on the substrate; and
   an organic light emitting diode (OLED) electrically coupled to the TFT,
   wherein the OLED comprises a counter electrode, a pixel electrode, and an intermediate layer between the counter electrode and the pixel electrode, and
   wherein the counter electrode and the first pattern layer are configured to form a first capacitor.

21. The organic light emitting display device of claim 20, wherein
   the first pattern layer is further configured to form a second capacitor with an object approaching the encapsulation substrate, and
   the first capacitor is electrically coupled in series with the second capacitor.

22. The organic light emitting display device of claim 1, further comprising a flexible printed circuit board (PCB) electrically coupled to the plurality of first sensors and the plurality of second sensors,
   wherein the flexible PCB comprises a circuit for driving and controlling the touch unit.

23. The organic light emitting display device of claim 22, further comprising a connector for delivering an electrical signal generated by the touch unit to the flexible PCB,
   wherein the connector is electrically coupled to the plurality of first sensors and the plurality of second sensors.

24. The organic light emitting display device of claim 1, wherein the plurality of pattern units are separated from each another on the insulation layer.

25. The organic light emitting display device of claim 1, wherein the pattern units have solid contacts formed at portions where the pattern units penetrate the insulating layer.

* * * * *